(12) United States Patent
Ferrari

(10) Patent No.: US 10,395,880 B2
(45) Date of Patent: Aug. 27, 2019

(54) ELECTRON GUN ADJUSTMENT IN A VACUUM

(71) Applicant: Varex Imaging Corporation, Salt Lake City, UT (US)

(72) Inventor: Chris Ferrari, San Jose, CA (US)

(73) Assignee: Varex Imaging Corporation, Salt Lake City, UT (US)

( * ) Notice: Subject to any disclaimer, the term of this patent is extended or adjusted under 35 U.S.C. 154(b) by 0 days.

(21) Appl. No.: 16/024,837

(22) Filed: Jun. 30, 2018

(65) Prior Publication Data

US 2019/0057830 A1  Feb. 21, 2019

Related U.S. Application Data

(60) Provisional application No. 62/548,387, filed on Aug. 21, 2017.

(51) Int. Cl.
| | |
|---|---|
| H01J 3/02 | (2006.01) |
| H01J 23/04 | (2006.01) |
| H01J 23/06 | (2006.01) |
| H01J 19/48 | (2006.01) |
| H01J 19/50 | (2006.01) |
| H01J 19/54 | (2006.01) |

(52) U.S. Cl.
CPC .............. *H01J 3/027* (2013.01); *H01J 3/022* (2013.01); *H01J 19/48* (2013.01); *H01J 19/50* (2013.01); *H01J 19/54* (2013.01); *H01J 23/04* (2013.01); *H01J 23/06* (2013.01)

(58) Field of Classification Search
CPC .. H01J 3/027; H01J 3/022; H01J 19/48; H01J 19/50; H01J 9/54; H01J 23/04; H01J 23/06
See application file for complete search history.

(56) References Cited

U.S. PATENT DOCUMENTS

| | | | | |
|---|---|---|---|---|
| 5,422,540 A | * | 6/1995 | Suzuki | .................. H01J 23/207 315/5.47 |
| 5,646,585 A | * | 7/1997 | Suzuki | .................. H01J 23/207 315/5.46 |
| 9,502,203 B1 | | 11/2016 | Borchard | |

(Continued)

OTHER PUBLICATIONS

Search Report mailed in PCT/US2018/047368 dated Dec. 24, 2018.
Written Opinion mailed in PCT/US2018/047368 dated Dec. 24, 2018.

*Primary Examiner* — Anne M Hines
(74) *Attorney, Agent, or Firm* — Laurence & Phillips IP Law

(57) ABSTRACT

Embodiments include a vacuum device, comprising: an enclosure configured to enclose a vacuum, the enclosure including an external base including an opening; an internal base within the enclosure; and an adjustable support assembly adjustably coupling the internal base to the external base and extending through the opening, the adjustable support assembly comprising: a threaded shaft extending along a longitudinal axis and coupled to the internal base; a threaded hole component threadedly engaged with the threaded shaft and coupled to the external base such that the threaded hole component is axially constrained in a direction along the longitudinal axis relative to the external base independent of the threaded shaft; and a flexible component coupled to the external base and the threaded shaft and sealing the opening.

20 Claims, 20 Drawing Sheets

(56) References Cited

U.S. PATENT DOCUMENTS

| | | | |
|---|---|---|---|
| 2011/0291545 A1* | 12/2011 | Durand | H01J 23/08 |
| | | | 313/442 |
| 2011/0291559 A1 | 12/2011 | Caryotakis | |
| 2012/0235770 A1 | 9/2012 | Chong | |
| 2013/0038200 A1* | 2/2013 | True | H01J 23/065 |
| | | | 313/443 |
| 2013/0187541 A1 | 7/2013 | Urakawa | |
| 2015/0060052 A1 | 3/2015 | Caryotakis | |
| 2016/0163494 A1 | 6/2016 | Kato | |
| 2018/0218874 A1* | 8/2018 | Cho | H01J 37/06 |
| 2018/0224642 A1 | 8/2018 | Cook | |

\* cited by examiner

US 10,395,880 B2

ELECTRON GUN ADJUSTMENT IN A VACUUM

RELATED APPLICATIONS

The present application claims priority U.S. Provisional Patent Application No. 62/548,387, which was filed on Aug. 21, 2017, entitled "Electron Gun Adjustment in A Vacuum and Electron Gun Thermal Dissipation," which is assigned to the assignee of the present invention, and is incorporated by reference herein.

BACKGROUND

Unless otherwise indicated herein, the approaches described in this section are not prior art to the claims in this disclosure and are not admitted to be prior art by inclusion in this section.

Linear beam electron devices are used in sophisticated medical, security inspection, communication, and radar systems that require amplification of a radio frequency (RF) or microwave electromagnetic signal. An electron gun is a component in some vacuum devices (e.g., electron devices, vacuum electron devices, or vacuum electric devices) that ideally produces a collimated electron beam that has a precise kinetic energy. The electron gun can be used in microwave linear beam vacuum tubes, such as klystrons, inductive output tubes, travelling wave tubes (TWT), backward wave oscillators, and gyrotrons, as well as in scientific instruments, such as electron microscopes, betatrons, and particle accelerators (e.g., linear particle accelerator [linac]). Electron guns may be classified by the type of electric field generation (e.g., direct current [DC] or radio frequency [RF]), by emission mechanism (e.g., thermionic, photocathode, field emission, or plasmas source), by focusing (pure electrostatic or with magnetic fields), and by the number of electrodes.

A conventional klystron is an example of a linear beam electron device used as a microwave amplifier that includes an electron gun. In a klystron, an electron beam is formed by applying a voltage potential between a cathode emitting electrons and an anode, accelerating these emitted electrons such that the cathode is at a more negative voltage with respect to the anode. The electrons originating at the cathode of an electron gun thereafter propagate through a drift tube, also called a beam tunnel, and are received by a collector assembly.

Depending on the size of the vacuum device, a cathode assembly (e.g., including the cathode, focus electrode, and associated heater assembly) of the electron gun assembly of the vacuum device can be quite large or heavy and difficult to align with the rest of the device (e.g., the drift tube or the beam tunnel). The support and alignment of electron guns used in high power microwave devices and accelerators can affect the operation of the device or accelerator. In large klystrons, and in particular sheet beam klystrons (SBKs), the cathode assembly can weigh over 20 pounds (lbs; 9 kilograms [kg]), and in some klystrons the cathode assembly can even weigh over 50 lbs (23 kg). The technology (systems, devices, and methods) described herein provides mechanisms to support and align an electron gun in a vacuum device.

Often during operation, the cathode assembly can generate an excessive amount of heat and thermal stress, i.e., high thermal load. The heat and thermal stresses on the components of the vacuum device, especially the cathode assembly, can lead to stress values greater than the yield strength of critical components of the vacuum device, such as the support and alignment features. The technology (systems, devices, and methods) described herein provides mechanism to increase thermal dissipation (i.e., decrease thermal loading) in particular locations of the electron gun, such as the support structure or alignment features.

DETAILED DESCRIPTION OF SOME EXAMPLE EMBODIMENTS

Figure 1:
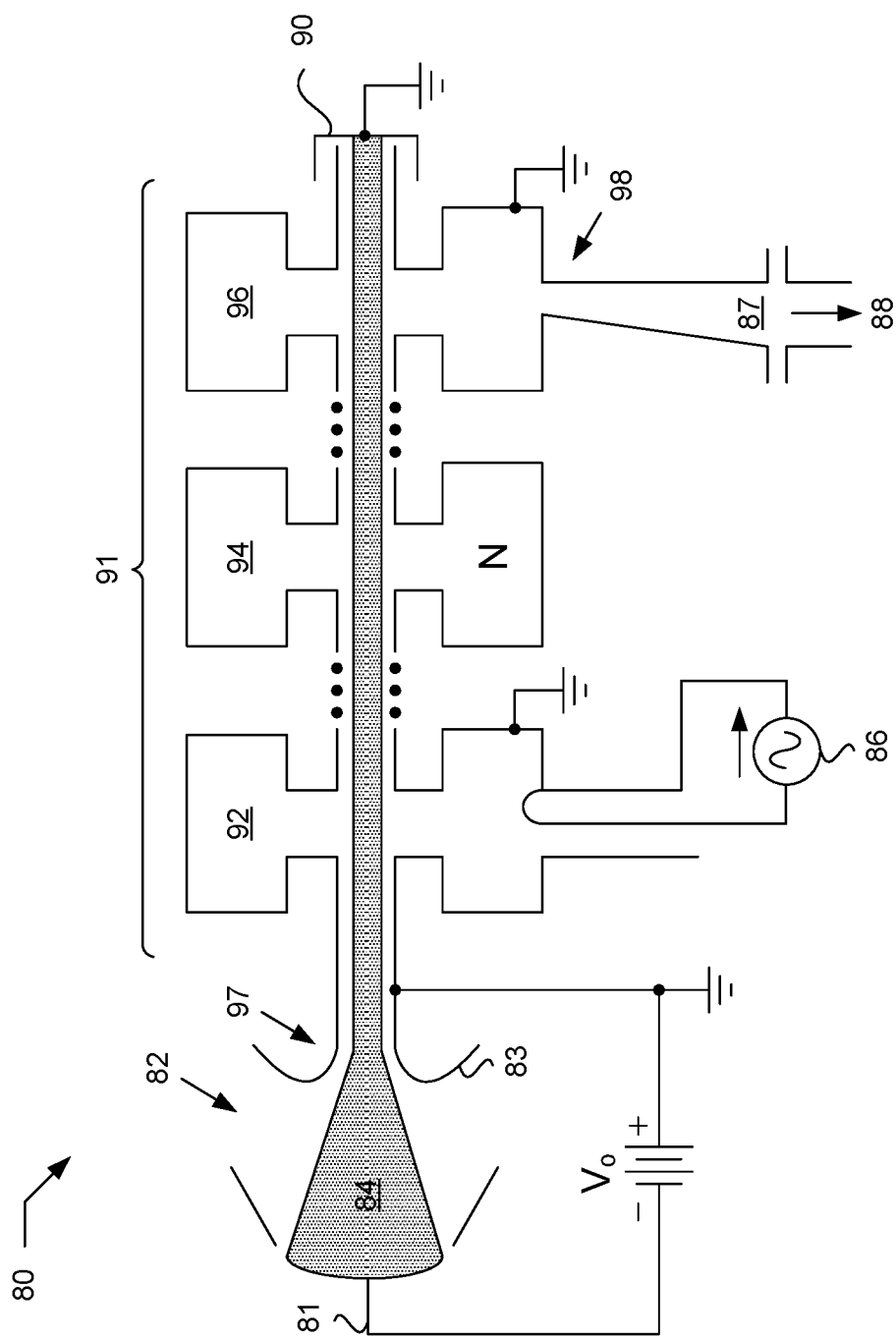
FIG. 1 illustrate a block diagram of an example klystron.

Before any embodiments are explained in detail, it is to be understood that all embodiments are not limited to the particular details of construction and the arrangement of components set forth in the following description or illustrated in the following drawings. Other embodiments may be practiced or carried out in various ways and may include various modifications. Numbers provided in flow charts and processes are provided for clarity in illustrating steps and operations and do not necessarily indicate a particular order or sequence. Unless otherwise defined, the term "or" can refer to a choice of alternatives (e.g., a disjunction operator, or an exclusive or) or a combination of the alternatives (e.g., a conjunction operator, and/or, a logical or, or a Boolean OR).

Some embodiments relate generally to alignment of components within an evacuated enclosure of a vacuum device while the device is still under vacuum, and more particularly, to various mechanism and components for aligning an electron gun or a cathode assembly component (e.g., a cathode, or a focus electrode) without disrupting the vacuum in the vacuum device.

In addition, some embodiments relate generally to thermally dissipative features to dissipate heat from support features and structures within the evacuated enclosure of the vacuum device, and more particularly, to thermal dissipative straps to transfer heat away from adjustable supports.

Reference will now be made to the drawings to describe various aspects of example embodiments. It is to be understood that the drawings are diagrammatic and schematic representations of such example embodiments, and are not limiting of all embodiments, nor are they necessarily drawn to scale.

Example Klystron

Vacuum devices or vacuum electron devices, such as klystrons, can be used to provided high power amplification of microwaves with output power up to tens of megawatts (MW). Typically, the klystron is a narrow bandwidth device with a bandwidth less than 10% of the input frequency, and in some examples, a bandwidth less than 1% of the input frequency.

Microwaves are a form of electromagnetic radiation with wavelengths ranging from one meter (1 m) to one millimeter (1 mm) with frequencies between 300 megahertz (MHz; 1 m) and 300 gigahertz (GHz; 1 mm), which can include ultra high frequency (UHF; 300 MHz and 3 GHz), super high frequency (SHF; 3 to 30 GHz), and extremely high frequency (EHF; millimeter wave; 30 to 300 GHz). With electromagnetic energy ranging from approximately 1 GHz to 100 GHz in frequency, the microwave spectrum can be further categorized in bands, such as L (1-2 GHz), S (2-4 GHz), C (4-8 GHz), X (8-12 GHz), $K_u$ (12-18 GHz), K (18-26.5 GHz), $K_a$ (26.5-40 GHz), Q (33-50 GHz), U (40-60 GHz), V (50-75 GHz), W (75-110 GHz), F (90-140 GHz), and D (110-170 GHz). Band L is associated with UHF, bands S through $K_a$ are associated with SHF, and bands Q through D are associated with EHF. Although, vacuum electron devices are typically associated with microwaves, such as klystrons providing microwave amplification, the adjustments and approaches described herein may also apply to higher frequency devices, such as those operating in the lower infrared spectrum, where the infrared electromagnetic radiation includes wavelengths ranging from one millimeter (1 mm) to 700 nanometers (nm) with frequencies between 300 GHz (1 mm) and 450 terahertz (700 nm). Reference to the term "microwave" as used herein may also include frequencies in lower infrared spectrum. In one example the term "microwave" includes frequencies between 300 MHz and 3 THz.

Although, the example vacuum devices are shown with adjustment mechanisms to adjust an electron gun or cathode assembly components within an evacuated enclosure, the mechanisms can also apply to other components that are supported by a base within a vacuum chamber.

FIG. 1 is a block diagram of an example klystron 80. The N+2-cavity klystron 80 includes an electron gun 82 that is configured to emit electrons, a resonator assembly 91 including N+2 cavities 92, 94, and 96, and collector 90. The electron gun 82 includes a cathode 81 that is configured to generate a beam of electrons (or electron beam) 84 that is accelerated towards an anode 83 by a voltage potential, $V_O$. The electron beam 84 enters a tube with multiple cavities, referred to as resonant cavities (or "bunch" cavities) 92, 94, and 96 connected with drift tubes (or drift tube sections). The electron beam is coupled to the tube referred to as electron beam coupling 97. The electron beam, at a first resonant cavity, referred to as an input cavity or "buncher" cavity 92, is acted upon a radio frequency (RF) voltage 86. The klystron amplifies the RF input signal by converting the kinetic energy in the direct current (DC) electron beam 84 into radio frequency power.

The structure of the resonant cavities 92, 94, and 96 are designed to create standing waves at a specified resonant frequency, usually near the input frequency, which produces an oscillating voltage which acts on the electron beam 84. The electric field causes the electrons to "bunch", in that the electrons passing through the resonant cavity when the electric field opposes the motion of the electrons are slowed, and the electrons passing through the resonant cavity when the electric field is in the same direction as the motion of the electrons are accelerated, causing the previously continuous electron beam to form bunches at or near the input frequency. To reinforce the bunching, a klystron may contain additional resonant cavities or "buncher" cavities 94. In some examples, a "buncher" cavity (or "bunch" cavity) refers to the first resonant cavity. In other examples, "buncher" cavities refer to the first resonant cavity and the additional resonant cavities. In the example shown in FIG. 1, the klystron has N resonant cavities 94 besides the input cavity 92 and the output cavity 96. Resonant cavities (e.g., N resonant cavities 94) are also referred to as intermediate resonant cavities. Typically, for conventional klystrons with normal tuning type configurations, each resonant cavity increases the gain by roughly 10 decibels (dB). Adding more resonant cavities can increase the RF gain or bandwidth. The electron beam 84 then passes through a "drift" tube in which the faster electrons catch up to the slower ones, creating the "bunches", then through an output cavity or "catcher" cavity 96. In the output "catcher" cavity 96, each bunch of electrons enters the cavity at a time in the cycle when the electric field opposes the electrons' motion, and thereby decelerates the electrons. Thus, the kinetic energy of the electrons is converted to energy of the electric field, increasing the amplitude of the oscillations. The oscillations excited in the output cavity 96 are coupled out through a waveguide 87 (or in other examples, a coaxial cable) to produce an amplified RF output signal 88. The coupling of the electric field to the waveguide 87 is referred to as waveguide coupling 98. The spent electron beam, with reduced energy, is captured by a collector electrode or collector 90.

Example Sheet Beam Klystron

Figure 2:
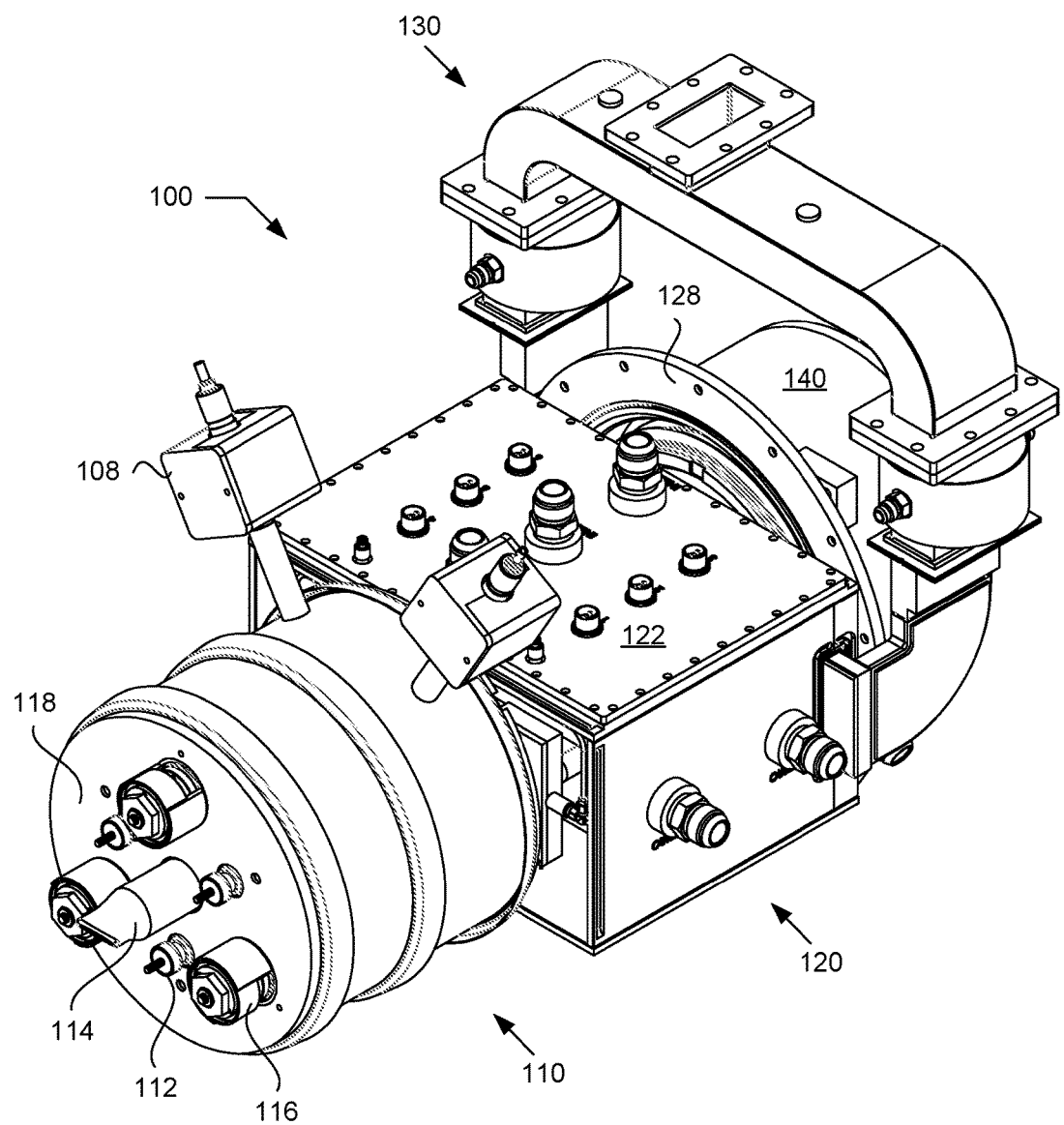
FIG. 2 illustrates a perspective view of an example sheet beam klystron (SBK).

FIG. 2 is a diagram of an example sheet beam klystron (SBK) 100, which is further described in U.S. Pat. No. 9,741,521, granted on Aug. 22, 2017, entitled "Vacuum Electron Device Drift Tube," which is incorporated by reference in its entirety. The SBK includes an electron gun assembly 110, a resonator assembly (or microwave cavity assembly) 120, a microwave output waveguide assembly 130 including various waveguide components, and a collector assembly 140 that includes the collector electrode (not shown). The resonator assembly 120 includes a magnetic return box 122 (which can also function as cooling box) that can enclose the resonant cavities (not labeled) and the drift tube sections (not labeled). The magnetic return box 122 can be enclosed on the input side (or electron gun side) with an electron gun side pole piece (not shown) and enclosed on the output side (or collector side) with collector side pole piece 128. The electron gun side pole piece is not shown in FIG. 2 so the resonant cavities and drift tube inside the magnetic return box 122 can be shown.

The electron gun assembly 110 includes the electron gun (not shown) that includes an electron emitter (not shown). The exterior of electron gun assembly 110 can include at least one vacuum ion pump 108, a vacuum pinch-off tube 114, and external base 118 (or electron gun base plate, electrode exterior base plate, or electrode external base plate). The vacuum ion pump 108 is a type of vacuum pump capable of reaching pressures as low as 10E-11 millibars (mbar) under ideal conditions. In some embodiments, the pressure the vacuum pump is capable of reaching is different. The vacuum ion pump ionizes gas within the vacuum device and employs a strong electrical potential, typically 3-7 kilovolts (kV), which allows the ions to accelerate into and be captured by a solid electrode and its associated features. The vacuum pinch-off tube 114 is the tube that is used to remove gas molecules from a sealed volume using an external pump in order to leave behind a vacuum in the vacuum device. Once the vacuum is achieved, the tube is crimped or pinched-off and sealed to maintain the vacuum without a main vacuum pump. The vacuum pinch-off tube 114 can extend from the external base 118. The external base 118 can also support cathode heater connectors 112 (or cathode heater electrical connectors) and adjustable support assemblies 116 (or adjustable cathode supports, adjustable support, translating shaft or column, or cathode alignment mechanism or indexers). The cathode heater connectors 112 provide electrical connection between a cathode heater and an electrical power supply that is external to the SBK 100. Typically, the components and structures of the electron gun assembly 110, especially within the vacuum device, include materials compatible for ultra high vacuum (UHV) conditions, such as stainless steel, nickel-cobalt ferrous (iron) alloys (Ni—Co—Fe alloy; e.g., Kovar), molybdenum (Mo), and tungsten (W). These materials often require a specific level of strength to support applicable loading forces and bending moments.

Example Adjustable Support Assembly

Beam formation and transport being inherently three dimensional (3D) can affect design of a vacuum device, such as electron gun design and magnetic focusing design. The mechanical concerns are at least in part and possibly largely due to both supporting and aligning a relatively large and/or heavy electron gun (specifically the heater, cathode, and focus electrode) as well as thermal and induced stress issues due to a relatively large cathode heater.

Figure 3A:
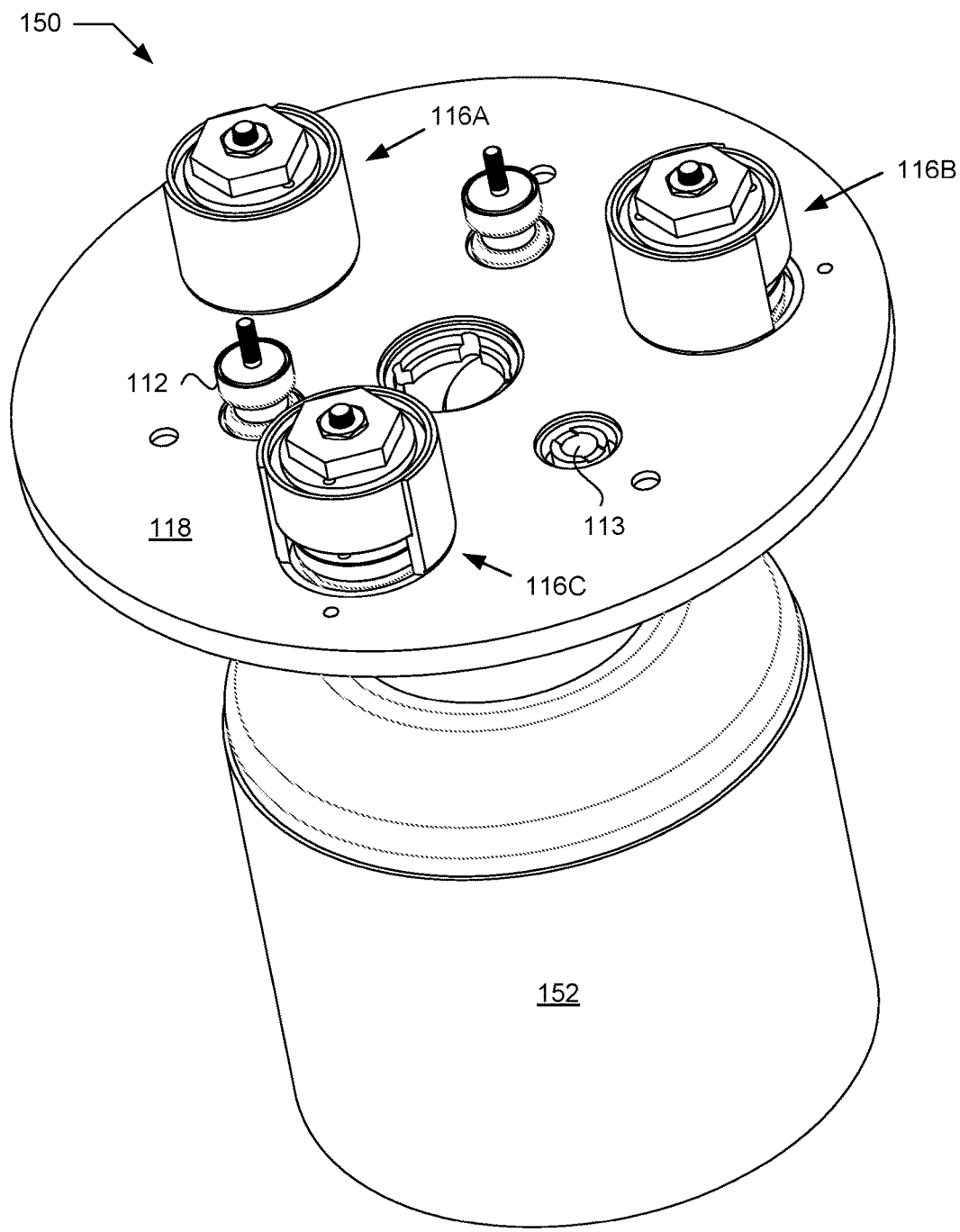
FIGS. 3A-3B illustrate perspective views of an example cathode assembly for a SBK.
Figure 3B:
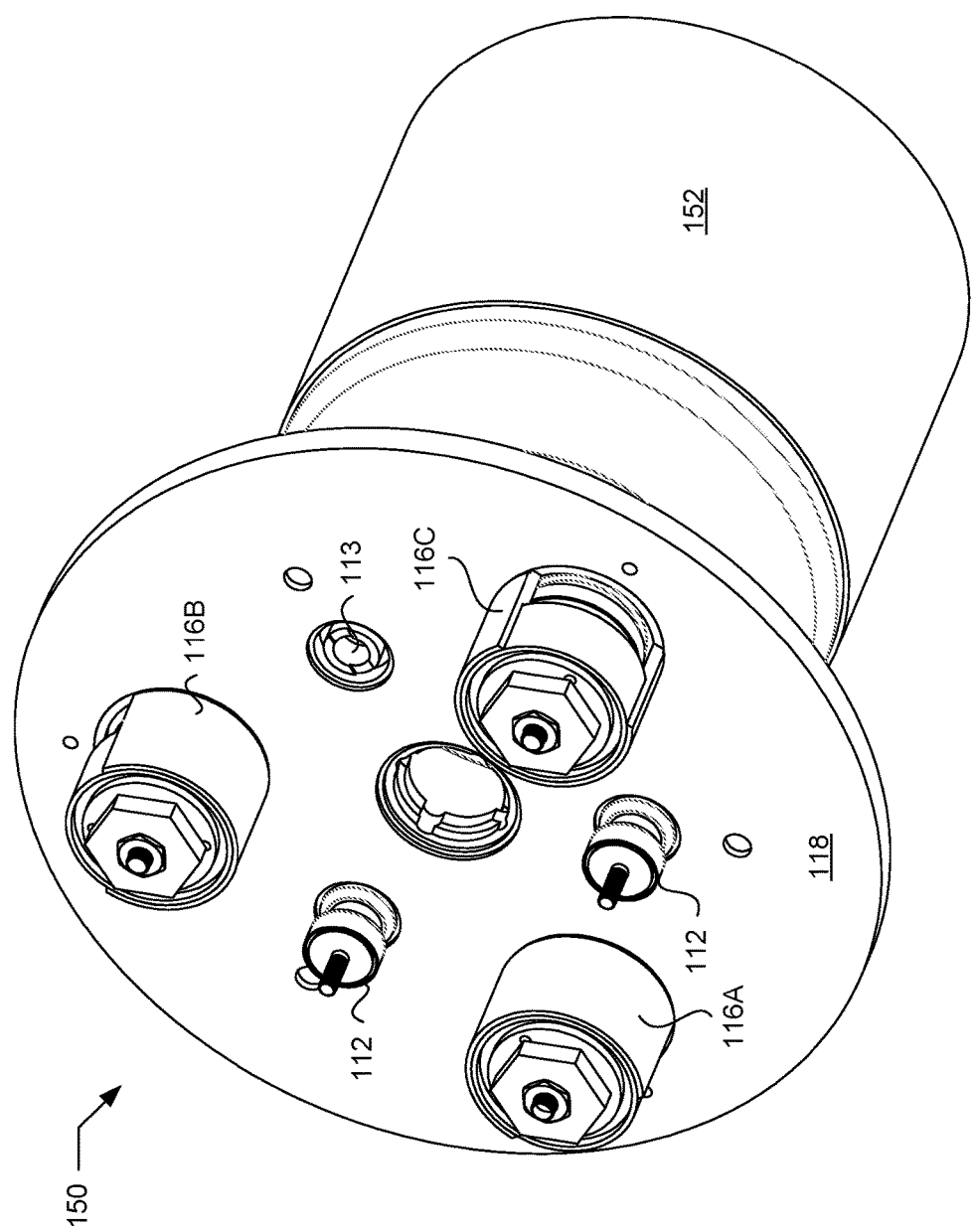
Figure 4:
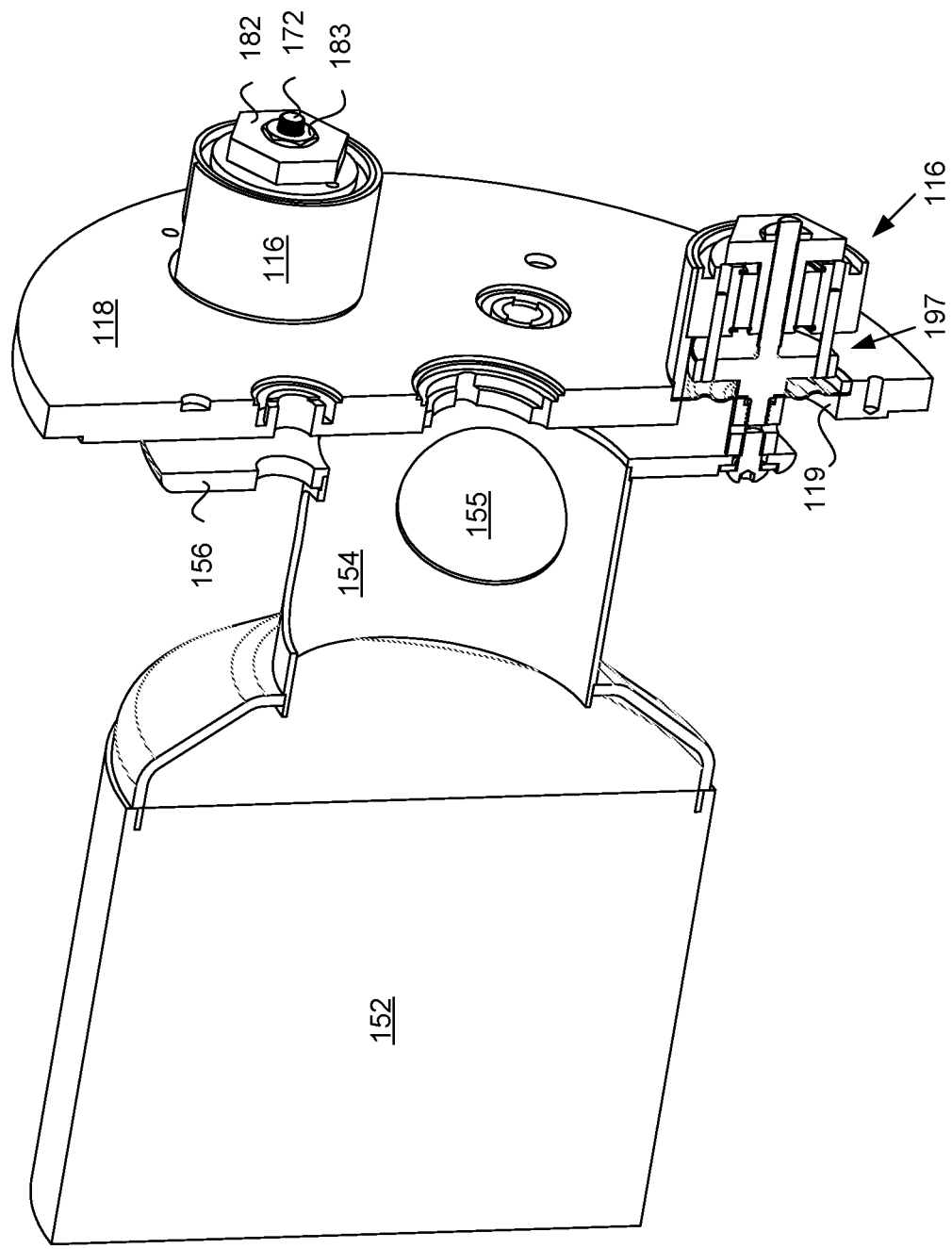
FIGS. 4-5 illustrate perspective half cross-sectional views of an example cathode assembly.
Figure 5:
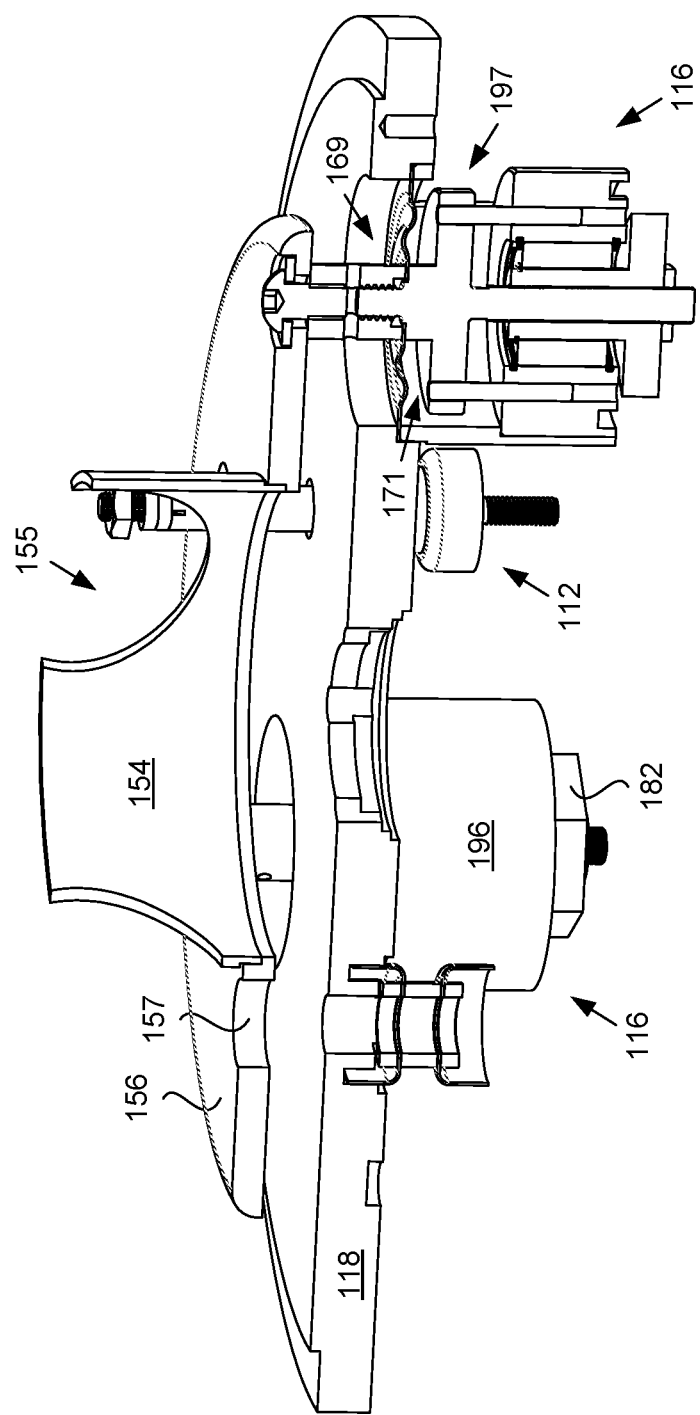
Figure 6A:
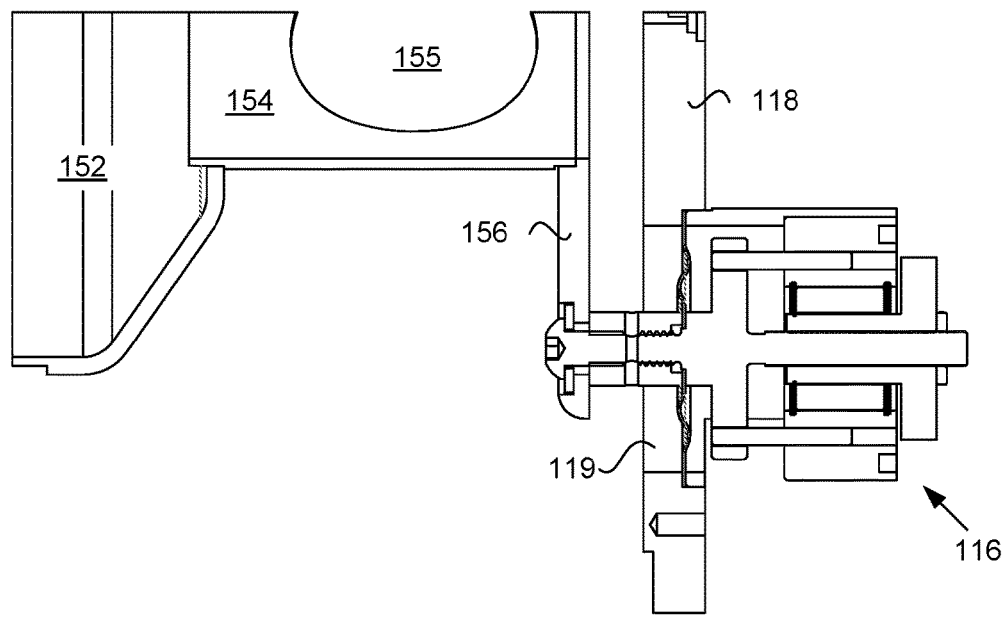
FIGS. 6A-6B illustrate quarter cross-sectional views of an example adjustable support assembly of a cathode assembly.
Figure 6B:
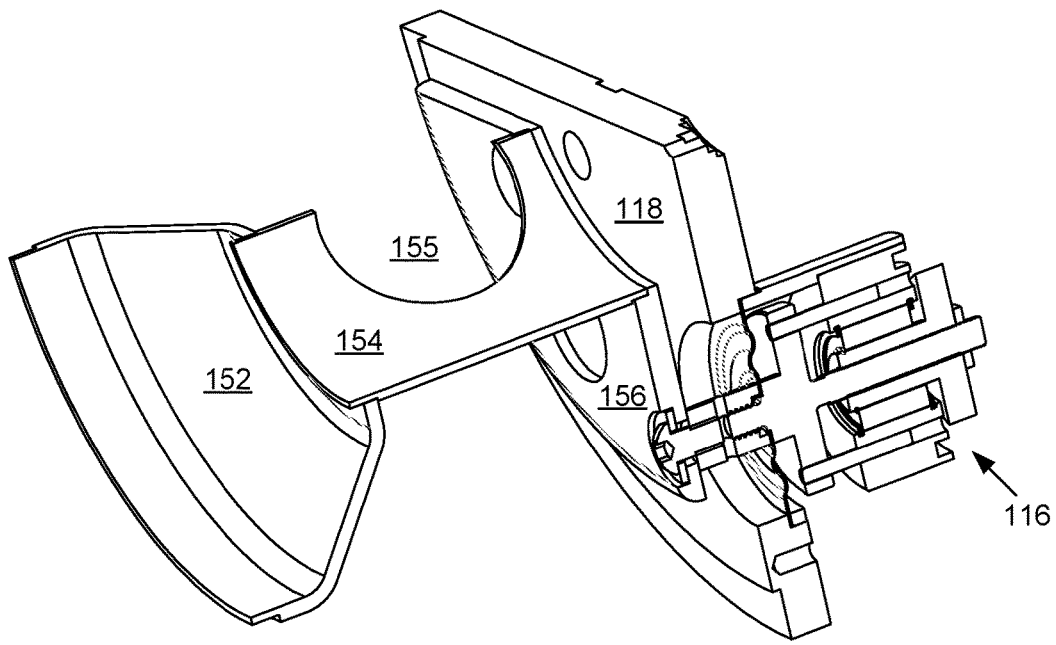

FIGS. 3A-3B, 4, 5, and 6A-6B illustrate the cathode assembly 150 that is part of the electron gun assembly 110 of FIG. 2. FIGS. 3A-3B illustrate perspective views of the cathode assembly 150 with the outside housing of electron gun assembly 110 removed, FIGS. 4 and 5 illustrate perspective half cross-sectional views of the cathode assembly 150 with the section across one adjustable support assembly 116, and FIGS. 6A-6B illustrate quarter cross-sectional views of the cathode assembly 150 with the section across one adjustable support assembly 116. The external base 118 supports the three adjustable support assemblies 116A-C so the adjustable supports can be accessed and adjusted external (outside the vacuum) to the vacuum device. The cathode heater connectors 112 are shown (two of the three) with the cathode heater connector hole (one of the three) or opening 113 (electron gun base cathode heater connector hole or opening, electrode exterior base cathode heater connector hole or opening, or electron gun base plate cathode heater electrical connector hole or opening) in the external base 118. Cathode assembly components 152 (e.g., cathode, focus electrode, or heater) are rigidly supported by cathode support 154 that is coupled to an internal base 156 (cathode base plate or interior base). FIGS. 3A-3B and 4 shows the external form factor (instead of the actual components) of the cathode assembly components 152. The cathode support 154 can include cathode support openings or windows 155 to allow electrical coupling from the external plate (e.g., cathode heater connectors) to the cathode assembly components 152 and to control radiation and conduction heat flow from cathode assembly components 152 to internal base 156. The external base 118 and internal base 156 can include holes or openings 113 and 157 to allow the cathode heater connectors 112 (or other connectors) to extend through the bases to interior of the cathode assembly 150. The cathode base plate hole or opening 157 is an opening in the internal base 156 for a cathode heater connector 112. The adjustable support assemblies 116 extends through an external base support hole or opening 119 (or electron gun base support hole or opening, electrode exterior base support hole or opening, or electrode external base support hole or opening). The adjustable support assemblies 116 provide an adjustable coupling between internal base 156 and the external base 118 which allows three-point adjustment of the cathode assembly components 152 relative to the rest of the vacuum device (e.g., anode, resonant cavities, and drift tube). In an example, at least one of the adjustable support assemblies 116 provides fine to very fine adjustments for cathode-to-anode spacing, focus electrode-to-anode spacing, or other types of spacing while simultaneously providing mechanical support, which can provide adjustment to the cathode (or focus electrode or other cathode assembly component 152) post-fabrication without disrupting the vacuum in the vacuum device or tube.

Figure 7:
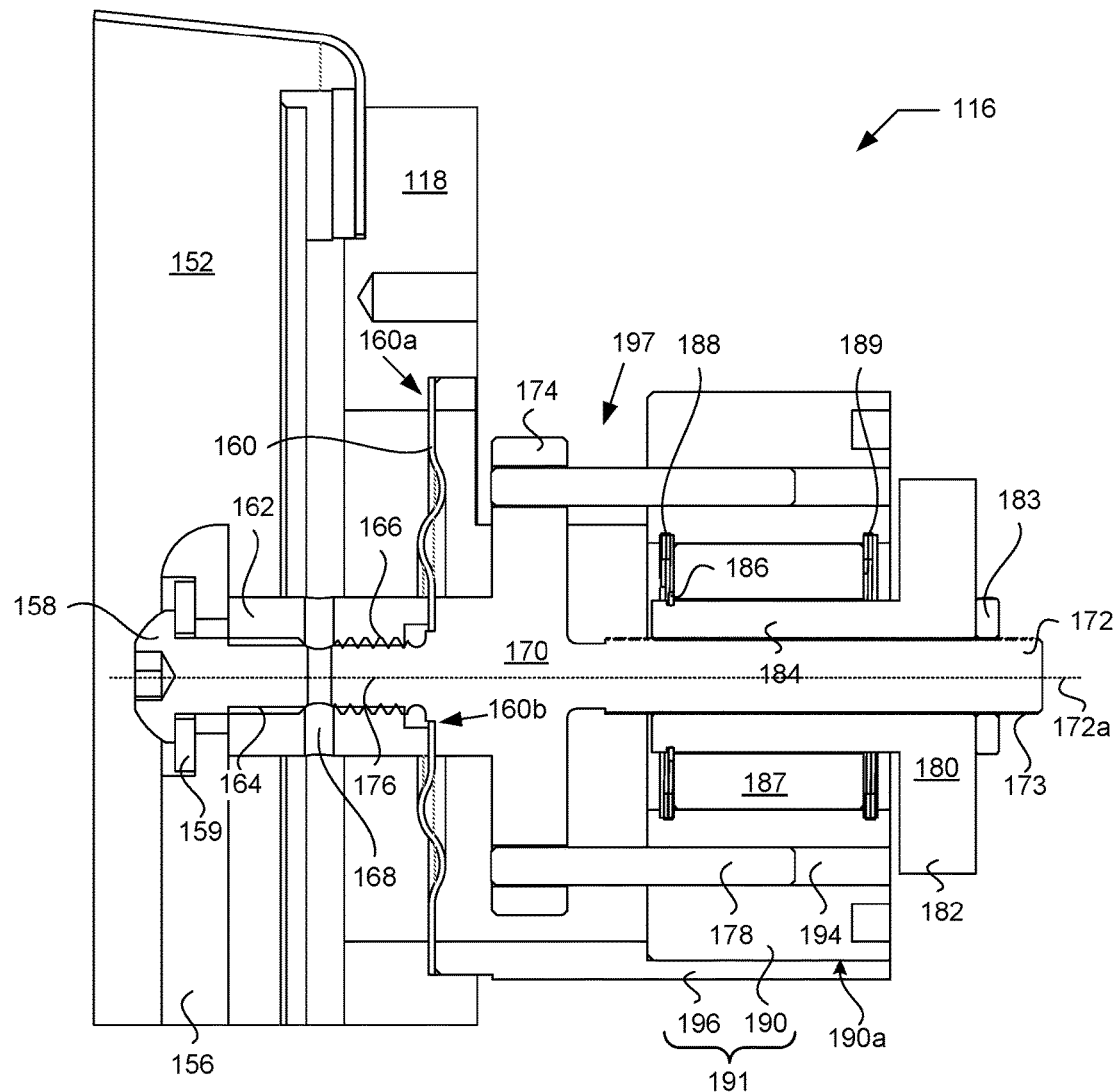
FIG. 7 illustrates cross-sectional view of an example adjustable support assembly.
Figures 8, 8A:
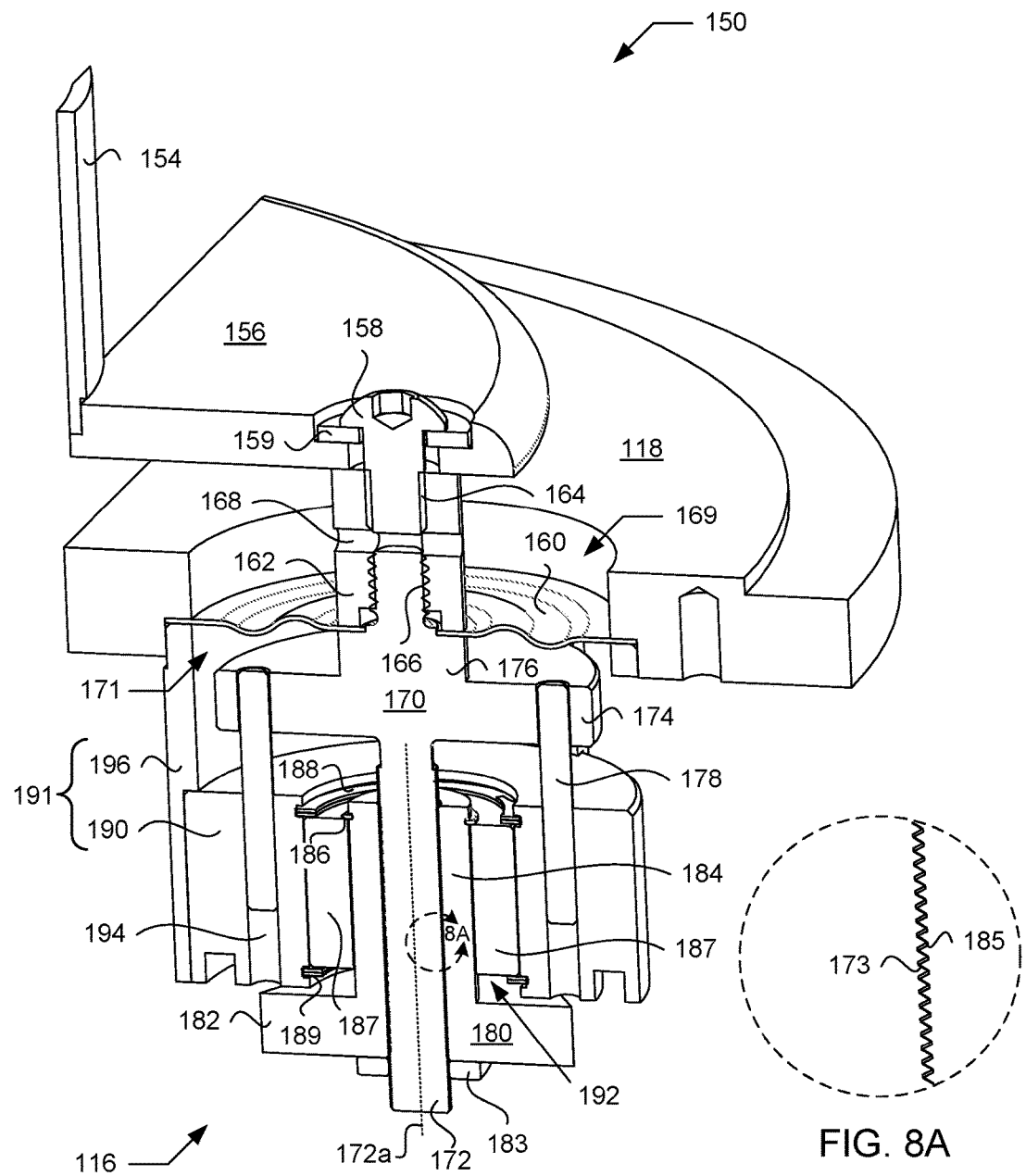
FIG. 8 illustrates perspective cross-sectional view of an example adjustable support assembly.
FIG. 8A illustrates an expanded view of threads between a linear shaft and a drive bushing of an example adjustable support assembly.

FIGS. 7-8 illustrate views of an adjustable support assembly 116. FIG. 7 illustrates a cross-sectional view of the adjustable support assembly 116, and FIG. 8 illustrates perspective cross-sectional view of the adjustable support assembly 116 with the section along the longitudinal axis 172a of the adjustable support assembly 116. As illustrated in FIGS. 7-8, the adjustable support assembly 116 can include a flexible component 160. The flexible component 160 is a structure that is capable of maintaining a vacuum seal while being deformed, such as by translation of a center portion relative to an outer perimeter. The flexible component 160 may be semi-flexible, elastic, resilient, or the like. Examples of the flexible component 160 include a thin-walled diaphragm 160' in FIG. 9A and metal bellows 160" in FIG. 9B. Although FIGS. 4-8 are illustrated using a diaphragm as the flexible component 160, any flexible component 160 may be used. The adjustable support assembly 116 also includes a spacer 162 (or plate standoff, plate sleeve, or cathode base plate spacer), a threaded shaft 170 (or linear threaded shaft with flange), an external base support assembly 191, and a threaded hole component 180.

In some embodiments, at least one electron component, such as an electron gun or a cathode assembly component 152, is supported and mechanically attached to a structure, such as a base or a plate. In an example, the internal base 156 within an evacuated enclosure is coupled to at least one adjustable support 116 that has some portion that is accessible outside the evacuated enclosure enclosing a vacuum. The at least one adjustable support 116 is adjustably coupled to an external base 118 forming at least a portion of the evacuated enclosure. The internal base 156 is within the evacuated enclosure and configured to support at least one cathode assembly component 152. The at least one cathode assembly component 152 includes a cathode, a focus electrode, a heater assembly, or the like. The at least one adjustable support 116 includes a flexible component 160, a spacer 162, a threaded shaft 170, an external base support assembly 191, and a threaded hole component 180. The flexible component 160 includes a flexible component periphery 160a that is in contact with the external base 118 or another support feature attached to the external base at a corresponding opening 119 of the external base 118.

In some embodiments, the threaded hole component 180 includes a drive bushing 184 with a nut 182. The drive bushing 184 is slidably engaged with the base cap 190 at the base cap opening 192. The drive bushing 184 with the nut 182 may be a single structure where the drive bushing 184 rotates when the nut 182 is rotated. A snap ring 186 may constrain movement of the threaded hole component 180 along the longitudinal axis 172a. In some embodiments, the snap ring 186 prevents outward movement of the threaded hole component 180 while the nut 182 contacting the base cap 190 prevents inward movement. In other embodiments, the snap ring 186 may be disposed in a different location to constrain movement of the threaded hole component 180 along the longitudinal axis 172a. In addition, while a single snap ring 186 has been used as an example, in other embodiments, more snap rings and/or other retaining structures may be used.

In some embodiments, a sleeve bearing 187 surrounds a portion of the drive bushing 184 of the threaded hole component 180. The sleeve bearing 187 is slidably engaged with the drive bushing 184. The sleeve bearing 187 is disposed in an opening 192 in the base cap 190. The sleeve bearing 187 is slidably engaged with the base cap 190 at the opening 192. One or more snap rings such as an inner snap ring 188 and an outer snap ring 189 may constrain movement of the sleeve bearing 187 along the longitudinal axis 172a relative to the base cap 190. The snap ring 186 may constrain movement of the threaded hole component 180 relative to the sleeve bearing 187. As a result, the movement of the threaded hole component 180 relative to the base cap 190 and hence the external base 118 may be constrained.

While a relative location of various snap rings has been used as examples, in other embodiments, the connection between the threaded hole component 180 and the external base 118 may be formed in different manners. Any attachment technique may be used that allows the threaded hole component 180 to rotate about the longitudinal axis 172a and be constrained in a direction along the longitudinal axis 172a.

FIG. 8A illustrates an expanded view of threads between a linear shaft and a drive bushing of an example adjustable support assembly. Referring to FIGS. 8 and 8A, the threaded hole component 180 includes threads 185 that interface with threads 173 of the threaded shaft 170. In some embodiments, a length of a threaded engagement of the threaded portion of the threaded shaft 170 with the threaded hole component 180 is at least two times the diameter of the threaded portion of the threaded shaft 170. As a result, movement of the threaded shaft 170 in a direction perpendicular to the longitudinal axis 172a may be reduced.

Figure 9A:
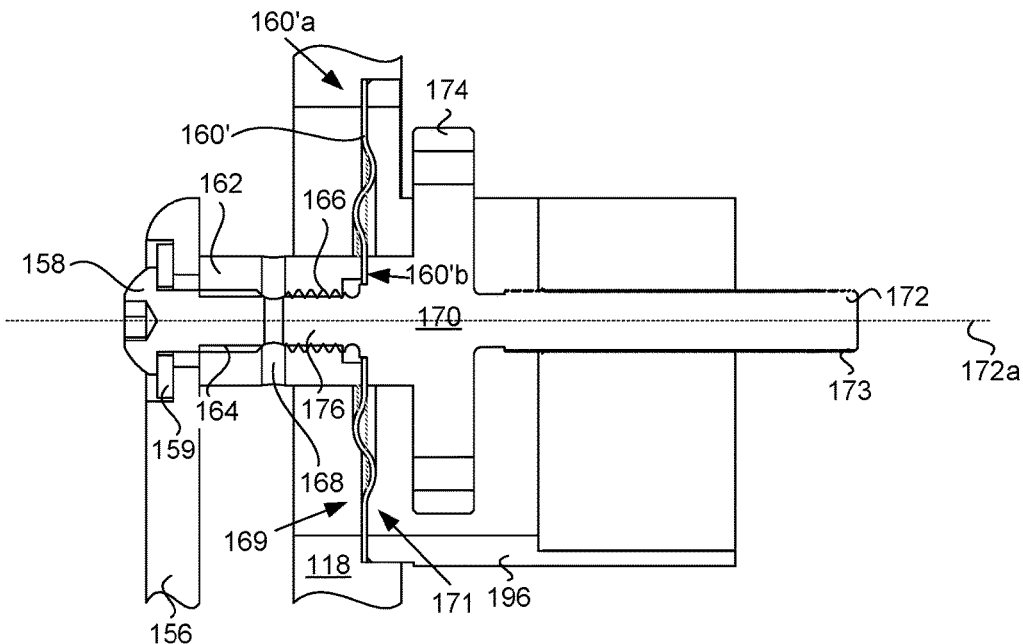
FIG. 9A illustrates cross-sectional view of an example adjustable support assembly with a flexible diaphragm component.
Figure 9B:
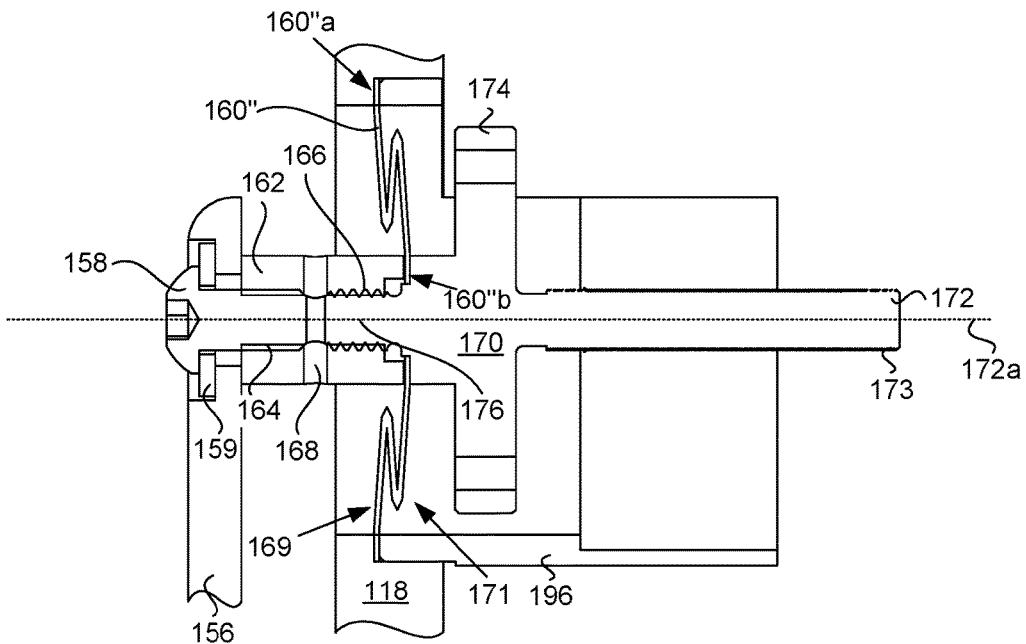
FIG. 9B illustrates cross-sectional view of an example adjustable support assembly with a flexible bellows component.

FIG. 9A illustrates cross-sectional view of an adjustable support assembly 116 with a diaphragm flexible component 160', and FIG. 9B illustrates cross-sectional view of an adjustable support assembly 116 with a bellows flexible component 160". The flexible component 160 can include a bellows 160" or a diaphragm 160' that allows a portion of the adjustable support 116 (and internal base 156) to move relative to the external base 118 of the evacuated enclosure while maintaining the vacuum within the evacuated enclosure. Although a diaphragm 160' and a bellows 160" are used as examples of a flexible component 160, in other embodiments, the flexible component 160 may have a different structure. In some embodiments, the flexible component 160 includes vacuum compatible materials with a maximum total mass loss (TML) of less than about 1% and a collected volatile condensable materials (CVCM) from outgassing of less than about 0.1% of starting materials at 398 K (125° C.) for at least 24 hours. The flexible component 160 may be formed of a variety of materials. In some embodiments, the materials may include cupronickel or the like.

The spacer 162 is positioned between a surface of the internal base 156 and a center area 160b, such as center areas 160'b and 160"b, of an inner side (i.e., vacuum side 169) of the flexible component 160. The spacer 162 provides a gap between the internal base 156 and external base 118. An internal base fastener 158 (or cathode base plate fastener; e.g., bolt or screw) can be used to couple the spacer 162 to the internal base 156. The spacer threads 164 (cathode base plate spacer threads) of the internal base fastener 158 can be used to tighten the spacer 162 to the internal base 156. An internal base washer 159 (or cathode base plate washer) can be positioned between the internal base fastener 158 and the internal base 156 to provide a better contact between to the internal base 156 and internal base fastener 158. The internal base 156 may be recessed or indexed for the internal base fastener 158 or the internal base washer 159. A midsection of the spacer 162 can include a gas release feature 168 (e.g., spacer hole, plate spacer hole, spacer slot, or spacer bore) to allow the release of outgasses from the spacer 162. Outgassing (sometimes called offgassing) is the release of a gas that was dissolved, trapped, frozen or absorbed in a material or component.

The threaded shaft 170 (or threaded linear shaft) is coupled to the spacer 162 on an outer side (e.g., exposed or non-vacuum side 171) of the center area 160b, such as center areas 160'b and 160"b, of the flexible component 160. The center area 160b of the flexible component is disposed or sandwiched between the spacer 162 and the threaded shaft 170 to provide a vacuum seal at the center area 160b of the flexible component 160. The threaded shaft 170 provides the mechanical attachment (e.g., rigid or fixed coupling) to the internal base 156 that is outside the vacuum. The threaded shaft 170 can include three sections: a shaft extension 176 that couples to the spacer 162, shaft flange 174 that can be used to reduce torque on the threaded shaft, and linear shaft 172 (or threaded portion of the threaded shaft 170) that can be used to adjust the spacing between the internal base 156 and external base 118. Although both the shaft extension 176 and linear shaft 172 both have a threaded portion, the threads on the linear shaft 172 are designed to adjust the internal base 156 relative to the external base 118 thus as used herein, the threaded portion refers to the threads on the linear shaft 172. Shaft plate spacer threads 166 (or external male threads) on the shaft extension 176 correspond to the shaft flange spacer threads (or internal female threads or threaded hole) on the spacer 162 and are used to tighten the spacer 162 to the threaded shaft 170. The external base support assembly 191 provides the supporting structure on the external base 118 for the threaded shaft 170.

In some embodiments, the shaft flange 174 extends radially from the linear shaft 172. The shaft flange 174 of the threaded shaft 170 is coupled to at least one aligning pin 178.

The at least one aligning pin 178 extends outward from the shaft flange 174 in a direction along the longitudinal axis 172a into a corresponding at least one aligning pin hole 194 of the base cap 190. The at least one aligning pin 178 is slidably engaged with the corresponding at least one on aligning pin hole 194. The interface of the at least one aligning pin 178 and the at least one aligning pin hole 194 reduce movement of the threaded shaft 170 in a direction perpendicular to the longitudinal axis 172a and/or reduce rotation of the threaded shaft 170 about the longitudinal axis 172a. In some embodiments, reducing the potential rotation of the threaded shaft 170 reduces torque on the flexible component 160.

The external base support assembly 191 provides the mechanical features on the external base 118 to support the threaded shaft 170 and seal the flexible component periphery 160a. The external base support assembly 191 is coupled to the external base 118 at or near the at least one opening 119 of the external base 118. The external base support assembly 191 includes a base cap 190 (or electron gun base plate cap or base plate cap) and an external base support 196 (or electron gun base plate ring or base plate ring). A portion of the base cap periphery 190a is coupled to the external base support 196. The external base support 196 is coupled to the external base 118 at the at least one opening 119 of the external base 118. A portion of the base cap periphery 190a is coupled to the external base support 196. As shown, the base cap 190 and external base support 196 are shown as separate components. In other examples, the base cap 190 and external base support 196 can be a single component, or at least two components that are brazed or otherwise joined together as a single component. The base cap 190 and external base support 196 can include mating features that allow the base cap 190 and external base support 196 to be joined or fitted together. The external base support assembly 191 is shown as a cylindrical or ring shape. In other examples, the external base support 196 can have a cuboid, triangular prism, hexagonal prism, octagonal prism, or other prism shape. The flexible component periphery 160a is disposed or sandwiched between the external base 118 and the external base support 190 to provide a vacuum seal at the flexible component periphery 160a. The joint between the external base 118 and the external base support 196 may be coupled together by a braze, a weld, or other adhesive mechanism that can withstand high temperatures. The external base support assembly 191 includes an external base support opening 192 and a linear shaft 172 of the threaded shaft 170 extends through the external base support opening 192. The external base support 196 includes an opening 197 through which the shaft flange 174 may be accessed.

The threaded hole component 180 is threadedly engaged with the linear shaft 172 of the threaded shaft 170 and configured to adjustably move the threaded shaft 170 relative to the base cap 190. The linear shaft threads 173 forming the threaded portion of the linear shaft 172 are threadedly engaged with the drive bushing threads 185 of the threaded hole component 180, as illustrated in FIG. 8A. In some embodiments, the pitch of the threads can be fine or extra fine for fine adjustment. Pitch is the distance from the crest of one thread to the next, which can be defined in terms of threads per inch (TPI). A fine pitch and extra fine pitch can be defined by the Unified Thread Standard (UTS) or International Organization for Standardization (ISO) metric screw threads.

The threaded hole component 180 is configured to adjustably move the threaded shaft 170 relative to the base cap 190. The external base support assembly 191 is fixed to the external base 118. In particular, the external base support assembly 191 is fixed to the external base such that the external base support assembly 191 is constrained in a direction along the longitudinal axis 172a.

In some embodiments, a jam nut 183 is used to fix the threaded shaft 170 to the threaded hole component 180. For example, after adjusting the position of the inner base 156 by the relative rotation of the threaded hole component 180 and the threaded shaft 170, the jam nut 183 may be tightened against threaded hole component 180. While a jam nut 183 is an example of a structure that can fix the threaded shaft 170 to the threaded hole component 180, in other embodiments, other structures may be used. For example, a shim may be used in place of or in addition to the jam nut 183.

Figure 10:
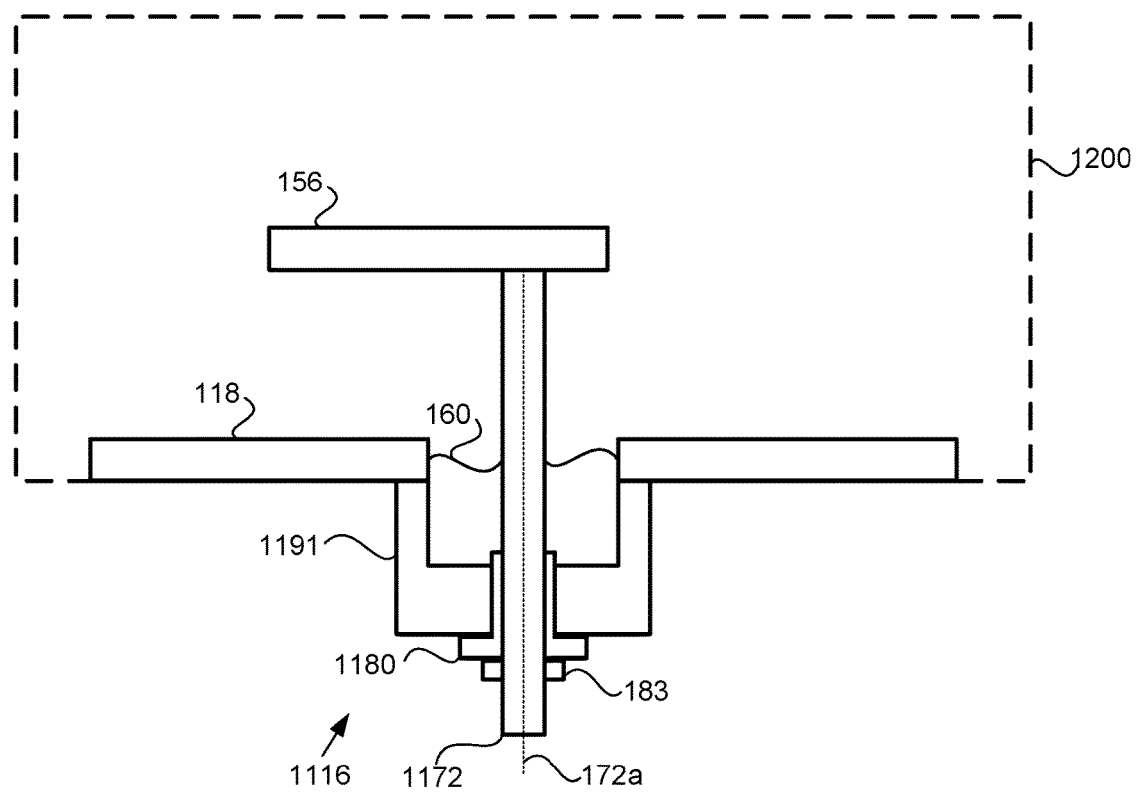
FIG. 10 is a block diagram of an example of an adjustable support assembly in a vacuum device.

FIG. 10 is a block diagram of an example of an adjustable support assembly in a vacuum device. In some embodiments, the adjustable support assembly 1116 is part of a vacuum device including an enclosure 1200 configured to enclose a vacuum. As described above, a variety of vacuum devices may include such an enclosure 1200, such as an electron gun, a sheet beam klystron, a round beam klystron, a multi-beam klystron, a relativistic klystron, a traveling wave tube, a gyrotron, a free electron laser, an electron microscope, an inductive output tube, or a linear accelerator. An adjustable support assembly 1116 may be part of such vacuum devices. In some embodiments, the adjustable support assembly 1116 may include a structure such as the adjustable support assembly 116 described above. The adjustable support assembly 1116 is configured to adjustably couple an internal base 156 within the enclosure to an external base 118 forming at least a part of the enclosure 1200. The adjustable support assembly 1116 extends through the opening 119.

The adjustable support assembly 1116 includes a shaft 1172. In some embodiments, the shaft is similar to the threaded shaft 170. The shaft 1172 extends along the longitudinal axis 172a and is coupled to the internal base 156. In some embodiments, the shaft 1172 may include structures such as the linear shaft 172, the spacer 162, or the like described above. In some embodiments the shaft 1172 may be a unitary structure. In some embodiments, the shaft 1172 may be integrated with the internal base 156.

A threaded component 1180 is threadedly engaged with either the support assembly 1191 or the shaft 1172. In some embodiments, the threaded component 1180 is coupled to the external base 118 through support assembly 1191 such that the threaded component 1180 is axially constrained in a direction along the longitudinal axis 172a relative to the external base 118 independent of the threaded shaft 1172. The threaded hole component 1180 may be similar to the threaded hole component 180 described herein and the shaft 1172 may be similar to the threaded shaft 170 and have corresponding engaged threads. The support assembly 1191 is axially constrained along the longitudinal axis 172a relative to the external base 118. Thus, when the threaded component 1180 is threadedly engaged with the shaft 1172, the shaft 1172 is also axially constrained in the direction along the longitudinal axis 172a. The coupling of the shaft 1172 to the internal base 156 results in the relative position also being axially constrained. In particular, the position of the internal base 156 is axially constrained by the engaged threads even if the jam nut 183 is not engaged with the threaded hole component 1180.

However, in other embodiments, the location of the threads may be different. For example, in some embodiments, the support assembly 1191 and the threaded component 1180 have the interfacing threads. Thus, the relative position of the threaded component 1180 and the support assembly 1191 may be changed through rotation of the threaded component 1180. In this example, the threaded component 1180 is rotatably coupled to the shaft 1172 and also axially constrained along the longitudinal axis 172*a* relative to the shaft 1172. As a result, the motion along the longitudinal axis 172*a* of the shaft 1172 is still constrained by an engagement of threads as described above; however, the interfacing threads are in a different location.

A flexible component 160 is coupled to the external base 118 and the threaded shaft 1172 such that the remainder of the opening is sealed. The flexible component 160 is coupled to each of the external base 118 and the threaded shaft 1172 in a manner that creates a hermetic seal. Accordingly, a vacuum seal may be maintained while providing an amount of adjustability.

With an adjustable support structure 1116, the jam nut 183 may be disengaged and the threaded hole component 1180 and/or the threaded shaft 1172 may be rotated relative to each other to adjust the relative position. In particular, the relative position may be adjusted while the vacuum device is under vacuum. The position is defined by the engagement of the threads of the threaded hole component 1180 and the threaded shaft 1172. Disengaging locking structures such as the jam nut 183 to allow adjustment does not cause the axial position to become unconstrained by the degree of disengagement of the locking structure. For example, if the jam nut 183 is disengaged by a centimeter, the axial range of motion of the threaded shaft 1172 and hence, the internal base 156 is not on the order of a centimeter. Rather, the axial range of motion is constrained by the engagement of the threads of the threaded hole component 1180 and the threaded shaft 1172

In particular electron gun structures, due to geometry, size, accuracy requirements, or the like, having the cathode or focus electrode-to-anode spacing "fixed" into the design by various indexing features (often called "hard alignment") can be very cumbersome, and at times, not possible. A common approach is to utilize a three-point column structure (each point usually 120° apart) with a flexible diaphragm for hermeticity that can adjust the entire structure by moving the columns individually per a variety of combinations to modify the tilt and height of the cathode or focus electrode. These three columns typically support the weight of the entire structure to prevent excessive stresses present within the thin-walled diaphragms. Current designs provide limited control and often have separate features for linear adjustments and mechanical support. When releasing the mechanical support for linear adjustments of the columns, the structure is at a level of risk. In some embodiments, an extra-fine threaded drive bushing linearly translates an accompanying shaft with the same threads. A relatively large amount of threads are engaged so the surface area supporting the weight of the structure is much greater than other methods used. The fine thread pitch offers very controlled linear translation and since thread engagement is present at all times, the mechanical support is consistent throughout all processing. Since the risk of temporarily loosing mechanical support during spacing adjustments is reduced, adjustments can confidently be executed at times otherwise not recommended, for example when the device is under vacuum or operating.

Figure 11A:
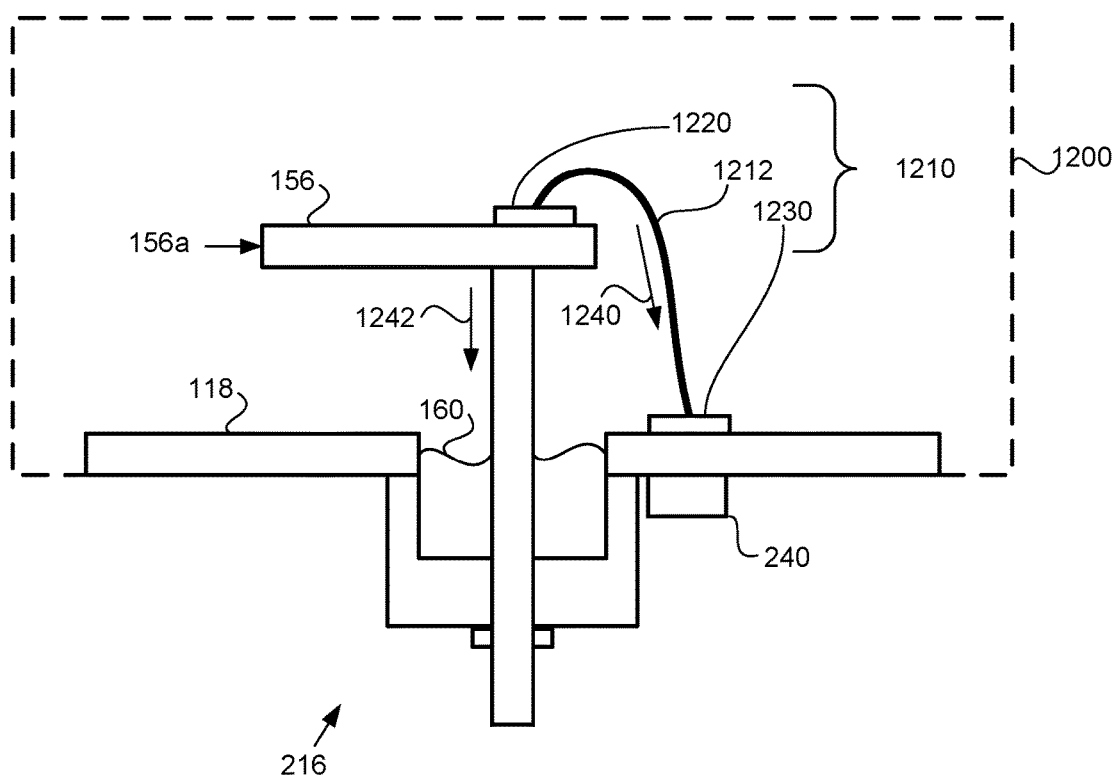
FIGS. 11A-B are block diagrams of examples of support assemblies with a thermal dissipative structure according to some embodiments.
Figure 11B:
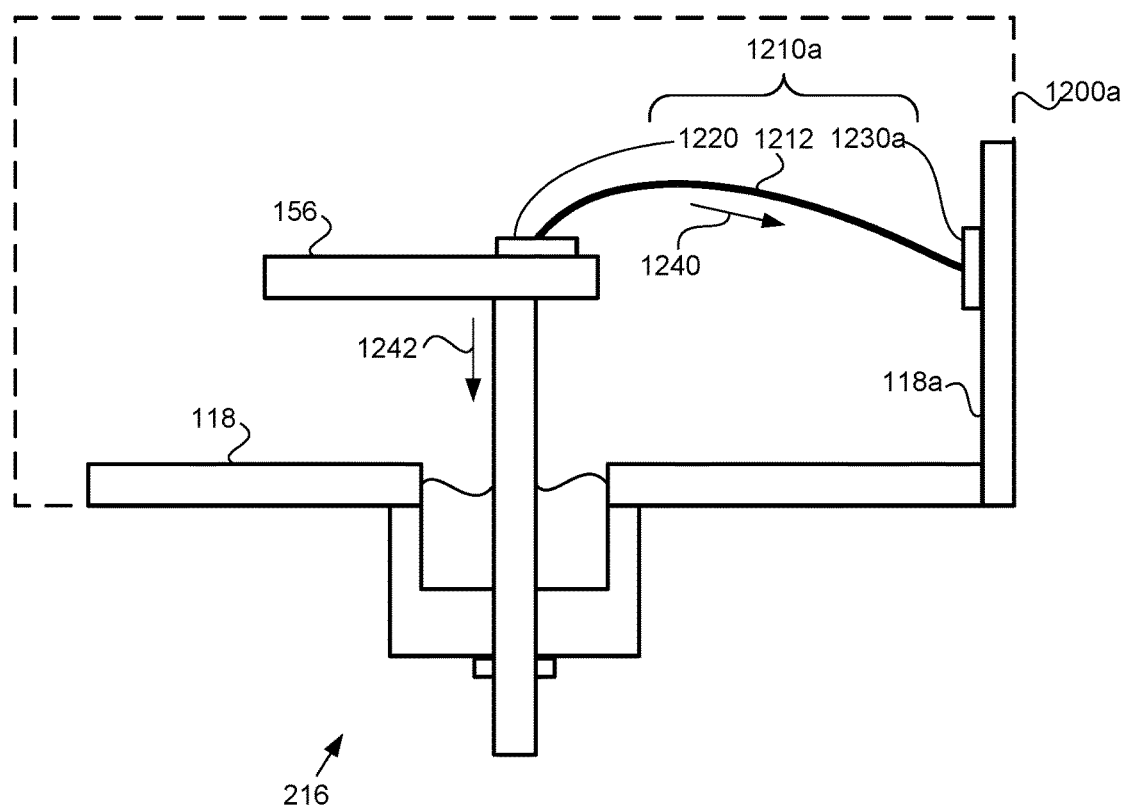

FIG. 11A-B are block diagrams of examples of support assemblies with a thermal dissipative structure according to some embodiments. Referring to FIG. 11A, in some embodiments, a thermal dissipative strap assembly 1210 is part of a vacuum device including an enclosure 1200 configured to enclose a vacuum. As described above, a variety of vacuum devices may include such an enclosure 1200, such as an electron gun, a sheet beam klystron, a round beam klystron, a multi-beam klystron, a relativistic klystron, a traveling wave tube, a gyrotron, a free electron laser, an electron microscope, an inductive output tube, or a linear accelerator.

The enclosure 1200 includes an external base 118 and an internal base 156 similar to those described above. The internal base 156 is disposed within the enclosure and coupled to the external base 118 through support assembly 216. In some embodiments, the support assembly 216 may be adjustable such as the adjustable support assembly 116 or 1116 described above; however, in other embodiments, the support assembly 216 may be adjustable but have a configuration different from the various adjustable support assemblies described herein. In addition, in some embodiments, the support assembly 216 may be fixed and not adjustable.

The thermal dissipative strap assembly 1210 is coupled to the external base 118 and the internal base 156. The thermal dissipative strap assembly 1210 includes an internal base thermal conductive base 1220, an external base thermal conductive base 1230, and a flexible thermal dissipative strap 1212 coupling the internal base thermal conductive base 1220 to the external base thermal conductive base 1230. As will be described in further detail below, more than one thermal dissipative strap assembly 1210 may couple the external base 118 to the internal base 156.

Heat flow 1240 and 1242 represent the flow of heat from the internal base 156 to the external base 118. Heat flow 1240 represents the heat flow through a thermal dissipative strap assembly 1210. Heat flow 1242 represents the heat flow through a support assembly 216. In some embodiments, a magnitude of the heat flow 1240 is greater than a magnitude of the heat flow 1242; however, in other embodiments, the relative magnitudes may be different. Regardless, at least some heat flows 1240 through the thermal dissipative strap assembly 1210 that would otherwise have flowed through the support assembly 216. The redirection of the heat reduces the operating temperature of the support assembly 216.

The flexible thermal dissipative strap 1212 may take different forms. In some embodiments, the flexible thermal dissipative strap 1212 includes a bent flat metal structure. In other embodiments, the flexible thermal dissipative strap 1212 includes a bent round, cylindrical, or ellipsoid shaped metal structure. In particular, the flexible thermal dissipative strap 1212 may be formed to flexibly deform through a range of relative motion of the internal base 156 and the external base 118. The shape of the flexible thermal dissipative strap 1212 may accommodate such motion, such as through bends or other flexible forms given the properties of the material of the flexible thermal dissipative strap 1212.

In some embodiments, the external base 118 includes a heat sink 240 disposed on an opposite surface to a surface where the external base thermal conductive base 1230 contacts the external base 118. As a result, heat that is conducted to the external base thermal conductive base 1230 may be dissipated through the external base 118 and the heat sink 240.

In some embodiments, a thermal conductivity of the internal base thermal conductive base 1220 is greater than a thermal conductivity of the internal base 156, or the thermal conductivity of the external base thermal conductive base 1230 is greater than a thermal conductivity of the external base 118. In some embodiments, the thermal conductivity of the thermal dissipative strap assembly 1210 is greater than the thermal conductivity of supporting structure 216.

The thermal dissipative strap assembly 1210 may be formed of a variety of materials. For example, the thermal dissipative strap assembly 1210 may be formed from materials with high thermal conductivity, vacuum compatible materials, or the like. In some embodiments, the materials may include oxygen-free copper (OFC), oxygen-free electronic (OFE) copper, or oxygen-free high thermal conductivity (OFHC) copper, or the like. In some embodiments, the materials may include gold or platinum. In some embodiments, the at least one thermal dissipative strap assembly includes vacuum compatible materials with a maximum total mass loss (TML) of less than about 1% and a collected volatile condensable materials (CVCM) from outgassing of less than about 0.1% of starting materials at 398 K (125° C.) for at least 24 hours. Although particular parameters of vacuum compatible materials have been used as examples, in other embodiments, vacuum compatible materials may have different parameters.

In some embodiments, the material of the thermal dissipative strap assembly 1210 may be selected based on the thermal conductivity rather than structural properties. That is, the thermal dissipative strap assembly 1210 may not provide significant structural support. However, as the support structure 216 provides the structural support for the internal base 156 and any mounted components, the thermal dissipative strap assembly 1210 need not be a material that is capable of providing that structural support in the same or similar configuration.

As described above, a vacuum device may include at least one cathode assembly component 152, such as a cathode, a focus electrode, heater, similar components, or the like that are supported by the internal base 156. Heat from the at least one cathode assembly component 152 that is conducted to the internal base 156 may be dissipated through one or more thermal dissipative strap assemblies 1210.

Although the internal base thermal conductive base 1220 is illustrated as being disposed on the internal base 156 on a side opposite to that facing the external base 118, in other embodiments, the internal base thermal conductive base 1220 may be disposed in other locations. For example, the internal base thermal conductive base 1220 may be disposed on the side of the internal base 156 facing the external base. In another example, the internal base thermal conductive base 1220 may be disposed on an edge of perimeter 156a of the internal base 156.

Referring to FIG. 11B, in some embodiments, the thermal dissipative strap assembly 1210a is similar to the thermal dissipative strap assembly 1210; however, the thermal dissipative strap assembly 1210a includes an external thermal conductive base 1230a that is attached to a wall 118a of the enclosure 1200a. For example, wall 118a may be a cylindrical wall of a vacuum enclosure 1200a. An enclosure thermal conductive base 1230a contacts the wall 118a. As a result, heat that is collected on the internal base 156 may be dissipated through the thermal dissipative strap assembly 1210a to a location other than those associated with the external base 118. In some embodiments, the wall 118a may be attached to the external base 118. However, in other embodiments, other intervening structures may be present.

Although the enclosure thermal conductive base 1230a has been described as being attached to a portion of the enclosure other than the external base 118, in other embodiments, the enclosure thermal conductive base 1230a may be attached to the external base 118 and form an external base thermal conductive base 1230.

Example Thermal Dissipative Strap Assembly

Figure 12A:
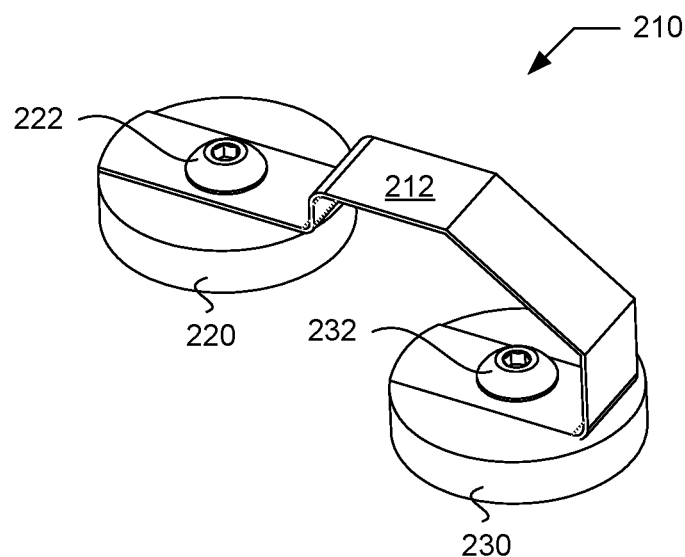
FIGS. 12A-12B illustrate views of an example thermal dissipative strap assembly.
Figure 12B:
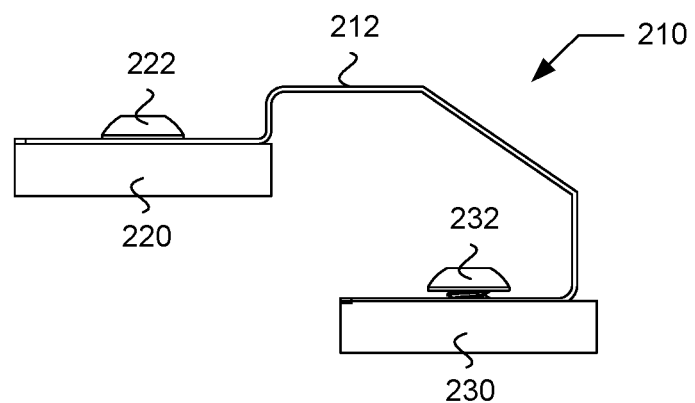

FIGS. 12A-12B illustrate views of an example thermal dissipative strap assembly. In some embodiments, the thermal dissipative strap assembly 210 may be used as the thermal dissipative strap assembly 1210. The thermal dissipative strap assembly 210 includes a thermal dissipative strap 212 coupled between an internal base thermal conductive base 220 and an external base thermal conductive base 230. The internal base thermal conductive base 220 and the external base thermal conductive base 230 are examples of the internal base thermal conductive base 1220 and the external base thermal conductive base 1230 described above.

In some embodiments, the internal base thermal conductive base 220 and the external base thermal conductive base 230 each have a cylindrical, disk, or puck shape. However, in other embodiments, the shape of the internal base thermal conductive base 220 and the external base thermal conductive base 230 may be different. In addition, although the internal base thermal conductive base 220 and the external base thermal conductive base 230 are illustrated as having the same size and shape, in some embodiments, the size and/or shape of the internal base thermal conductive base 220 and the external base thermal conductive base 230 may be different from each other.

The internal base thermal conductive base 220 and the external base thermal conductive base 230 are illustrated as having generally the same orientation. However, the internal base thermal conductive base 220 and the external base thermal conductive base 230 may have different orientations based on how the internal base thermal conductive base 220 and the external base thermal conductive base 230 are attached to the internal base 156 and external base 118, respectively.

The internal base thermal conductive base 220 is attached to the thermal dissipative strap 212 by thermal conductive base fastener 222. Similarly, the external base thermal conductive base 230 is coupled to the thermal dissipative strap 212 by thermal conductive base fastener 232. The thermal conductive base fasteners 222 and 232 may also attach the internal base thermal conductive base 220 and the external base thermal conductive base 230 to the internal base 156 and the external base 118 or wall 118a. Although fasteners 222 and 232 are used as examples, in other embodiments, the thermal dissipative strap 212 may be attached to the internal base thermal conductive base 220 and the external base thermal conductive base 230 by brazing, welding, or other thermally conductive attachment techniques.

The shape of the thermal dissipative strap 212 is an example of a shape that can accommodate a range of motion between surfaces on which the internal base thermal conductive base 220 and the external base thermal conductive base 230 are mounted. In this example, the path of the thermal dissipative strap 212 is not the shortest possible between the internal base thermal conductive base 220 and the external base thermal conductive base 230. As a result, the thermal dissipative strap 212 may deform as the relative position of the internal base thermal conductive base 220 and the external base thermal conductive base 230 changes within a given range.

Figure 13:
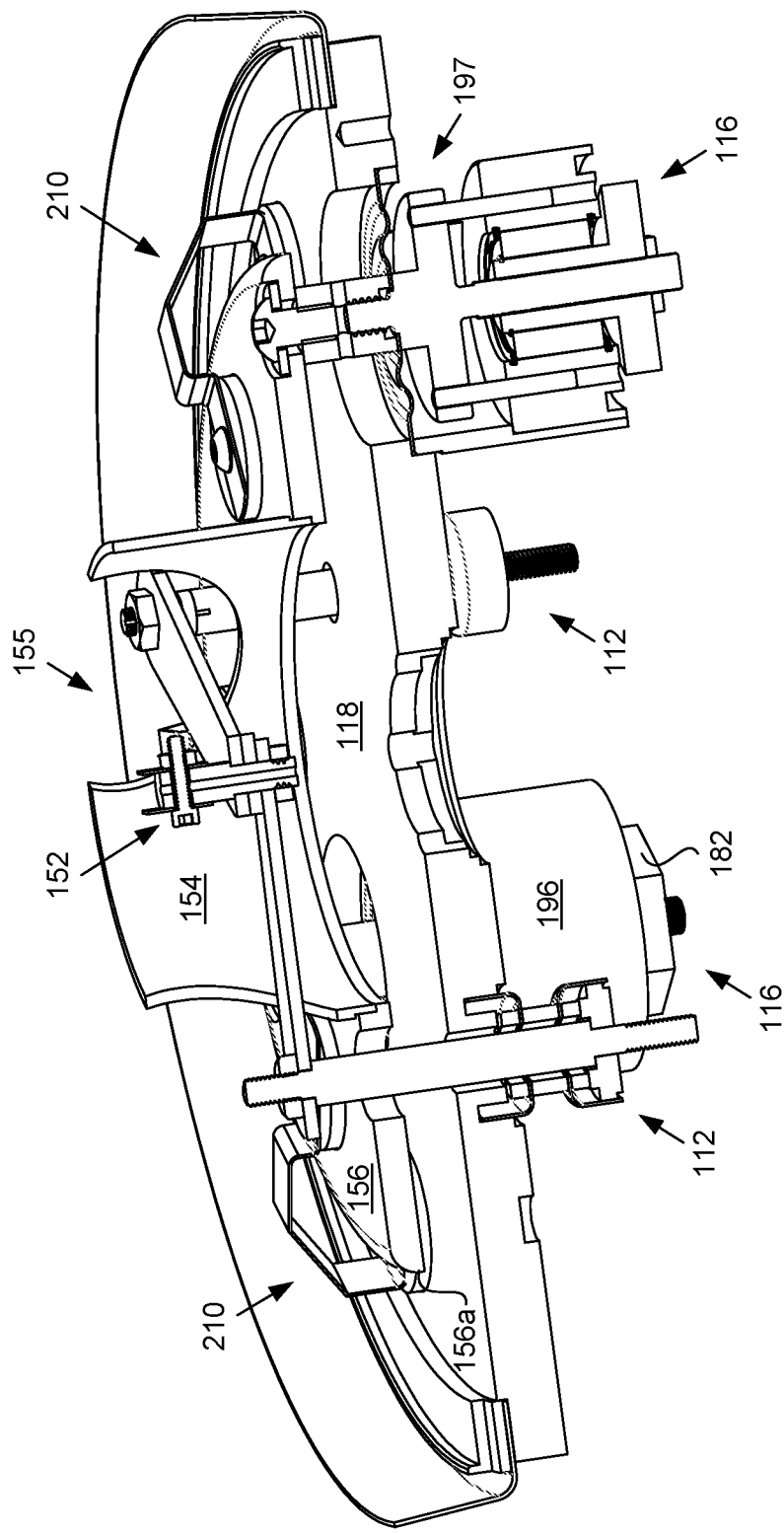
FIG. 13 illustrates a perspective cross-sectional view of an example cathode assembly with adjustable support assemblies, thermal dissipative strap assemblies, and cathode heater connectors.

FIGS. 13-16 illustrate a variety of views an example cathode assembly with thermal dissipative strap assemblies. In this particular example, FIG. 13 illustrates a perspective cross-sectional view of an example cathode assembly with adjustable support assemblies 116, thermal dissipative strap assemblies 210, and cathode heater connectors 112. The cathode assembly may be similar to those described above in FIGS. 2-9B. The cathode heater connectors 112 are examples of electrical connections to cathode assembly components 152 that may conduct heat; however, other cathode assembly components 152 may also conduct and generate heat.

One or more thermal dissipative strap assemblies 210 may be coupled between the external base 118 and the internal base 156. The thermal dissipative strap assemblies 210 may be similar to the thermal dissipative strap assembly 1210 described above. The thermal dissipative strap assemblies 210 are disposed along an outer perimeter 156a of the internal base 156. In some embodiments, the internal base 156 has a generally cylindrical or toroidal shape. At least some heat that is conducted from the cathode assembly components 152 may be dissipated through the internal base 156 through the thermal dissipative strap assemblies 210 to the external base 118 rather than through the adjustable support structure 116.

Figure 14A:
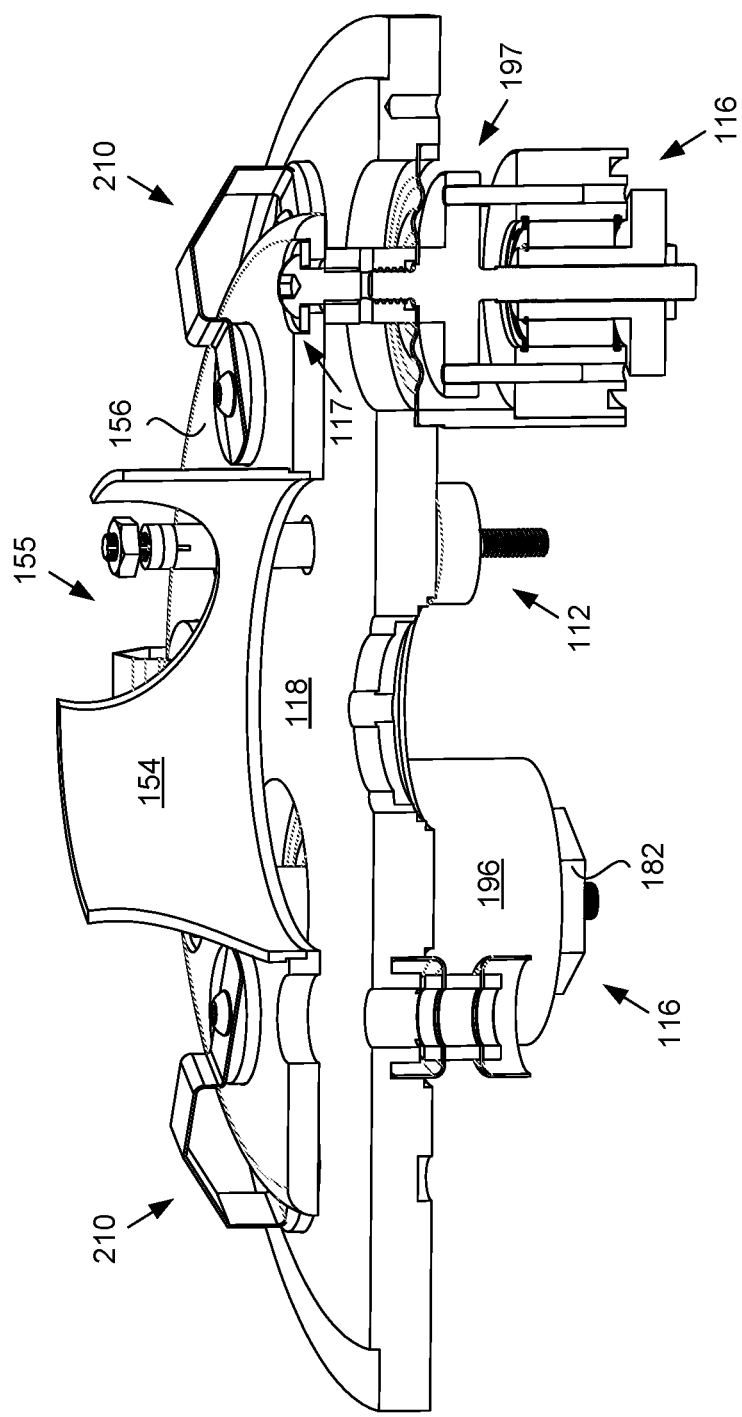
FIG. 14A-14B illustrate perspective views of an example cathode assembly with adjustable support assemblies and thermal dissipative strap assemblies.
Figure 14B:
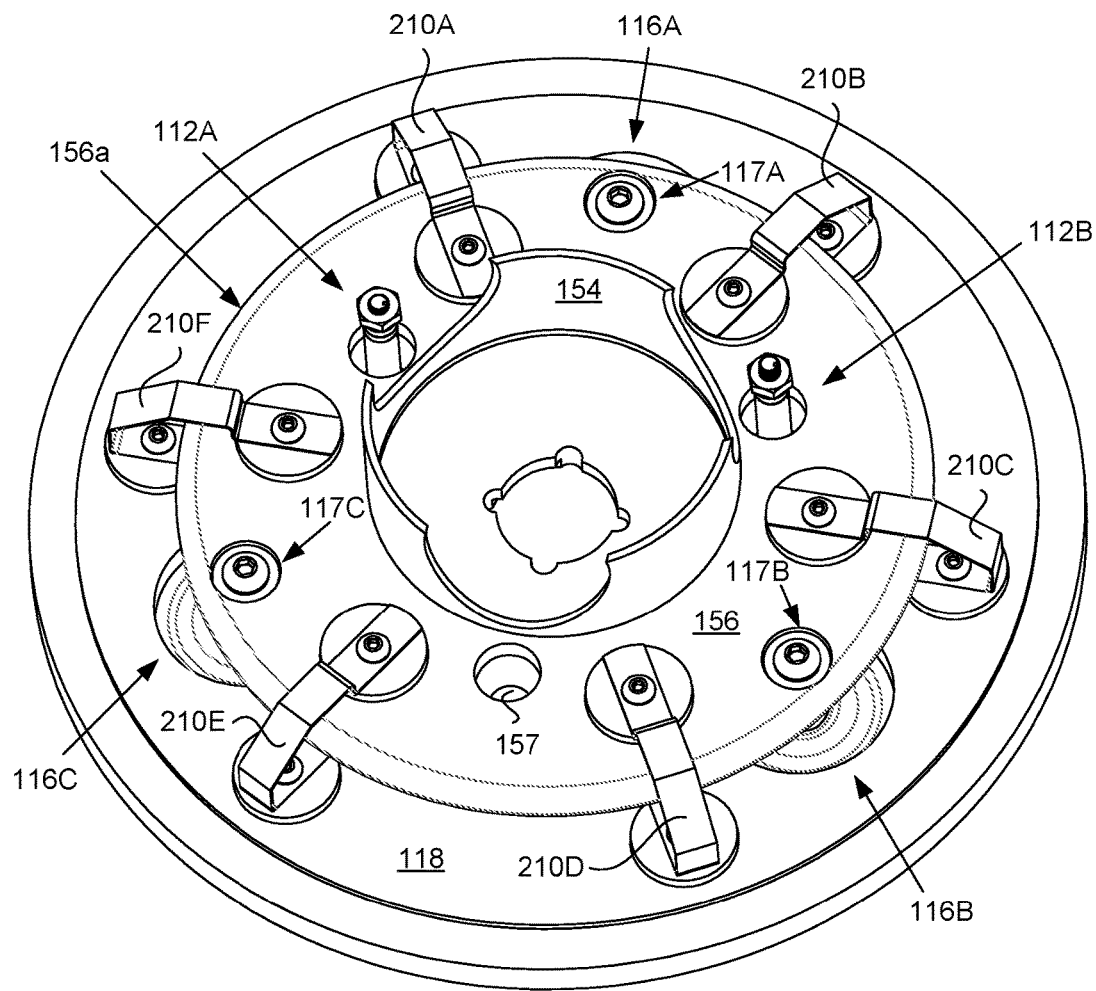
Figure 14C:
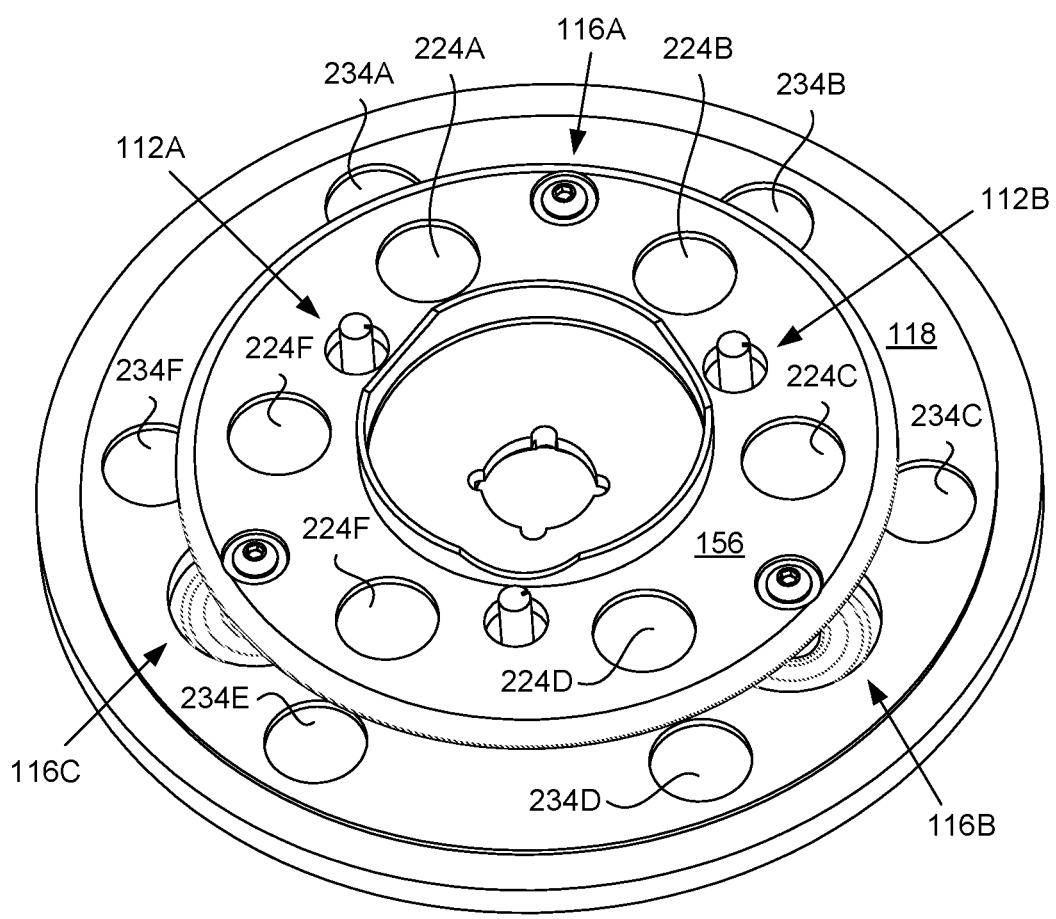
FIG. 14C illustrates a perspective view of base plate indexing for thermal dissipative strap assemblies and adjustable support assemblies.
Figure 15:
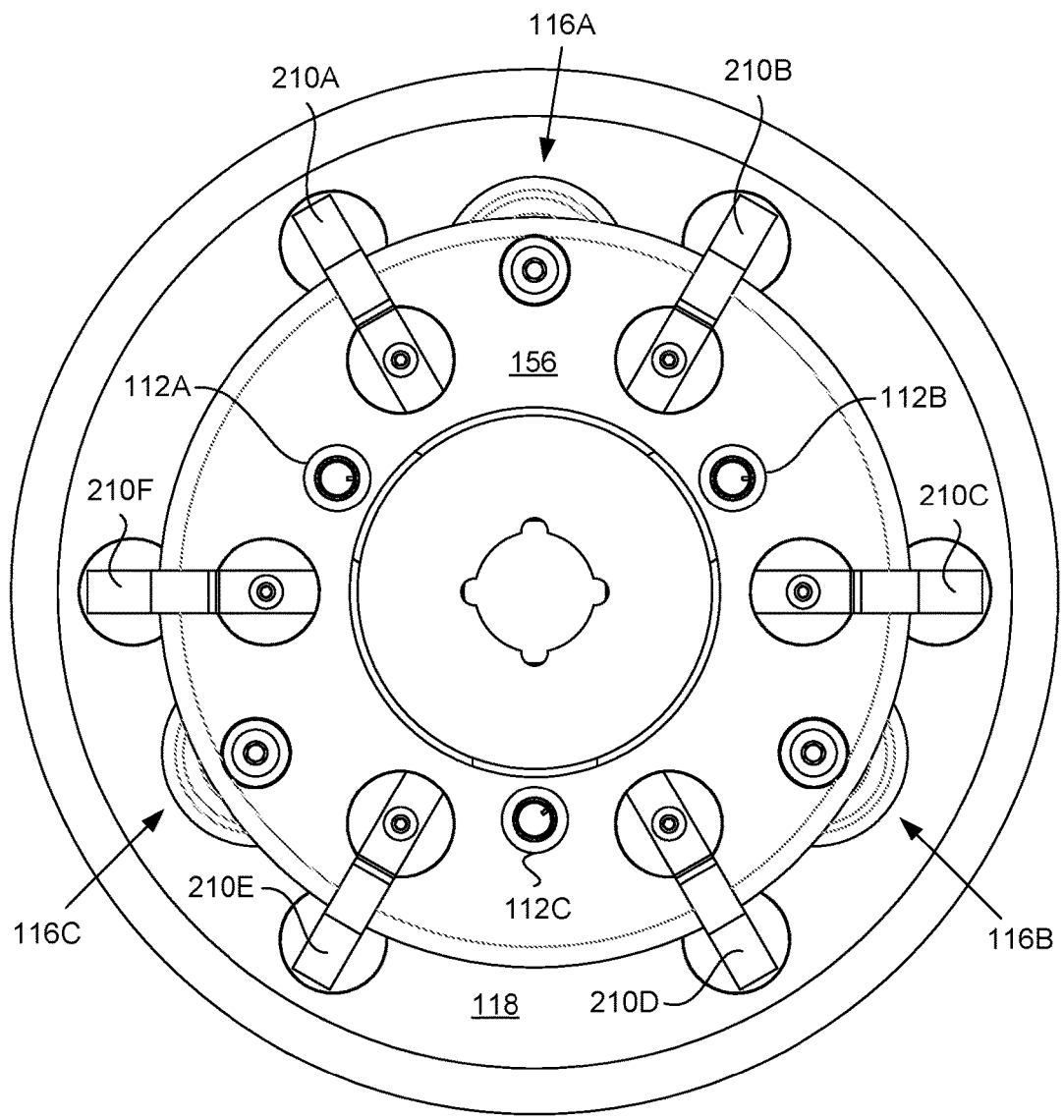
FIG. 15 illustrates a top view of an example cathode assembly with adjustable support assemblies, thermal dissipative strap assemblies, and cathode heater connectors.

FIG. 14A-14B illustrate perspective views of an example cathode assembly with adjustable support assemblies 116 and thermal dissipative strap assemblies 210. FIG. 14C illustrates a perspective view of base plate indexing for thermal dissipative strap assemblies 210 and adjustable support assemblies. FIG. 15 illustrates a top view of an example cathode assembly with adjustable support assemblies 116, thermal dissipative strap assemblies 210, and cathode heater connectors 112.

Referring to FIGS. 14A-14B, the adjustable support assemblies 116A-C contact the internal base 156 at corresponding contact locations 117. In some embodiments, the internal base thermal conductive bases 220 of the thermal dissipative strap assemblies 210A-F are disposed on the internal base 156 among contact locations 117 of the adjustable support assemblies 116A-F to the internal base. For example, each of the contact locations 117 is adjacent to a corresponding one of the internal base thermal conductive bases 220. That thermal conductive base 220 may act as a local heat sink to dissipate heat from the local area adjacent the contact location 117. In some embodiments, each contact location 117 is adjacent to a corresponding two of the internal base thermal conductive bases 220.

This example includes three adjustable support assemblies 116A-C. As described above, the three adjustable support assemblies 116A-C may form a three-point column structure for the internal base 156. The three adjustable support assemblies 116A-C are associated with six thermal dissipative strap assemblies 210A-F. As illustrated, for each of the contact locations 117A-C, the corresponding adjacent thermal conductive bases 220 of the thermal dissipative strap assemblies 210 are generally on opposite sides of that contact location 117. As a result, heat flowing from multiple directions towards the contact location 117 and hence, the corresponding adjustable support assembly 116 will be reduced. In addition, two of the thermal dissipative strap assemblies 210 are disposed between each pair of adjustable support assemblies 116. For example, thermal dissipative strap assemblies 210B and 210C are disposed between the adjustable support assemblies 116A and 116B.

While the number of thermal dissipative strap assemblies 210 that is twice the number of adjustable support assemblies 116 is illustrated as an example, in other embodiments the number may be different. In some embodiments include only one adjustable support assembly 116 and multiple thermal dissipative strap assemblies 210 while other embodiments include multiple adjustable support assemblies 116 and only one thermal dissipative strap assembly 210. Other embodiments have different numbers of multiple adjustable support assemblies 116 and multiple thermal dissipative strap assemblies 210.

FIG. 14C illustrates a perspective view of base plate indexing for thermal dissipative strap assemblies and adjustable support assemblies. In some embodiments, the internal base 156 includes at least one recess 224 configured to receive the internal base thermal conductive base 220. In some embodiments, the external base 118 includes at least one recess 234 configured to receive the external base thermal conductive base 230. As illustrated, six recesses 224A-F and six recesses 234A-F correspond to locations where internal base thermal conductive bases 220A-F and external base thermal conductive bases 230A-F are recessed and attached to the corresponding internal base 156 or external base 118.

Figure 16:
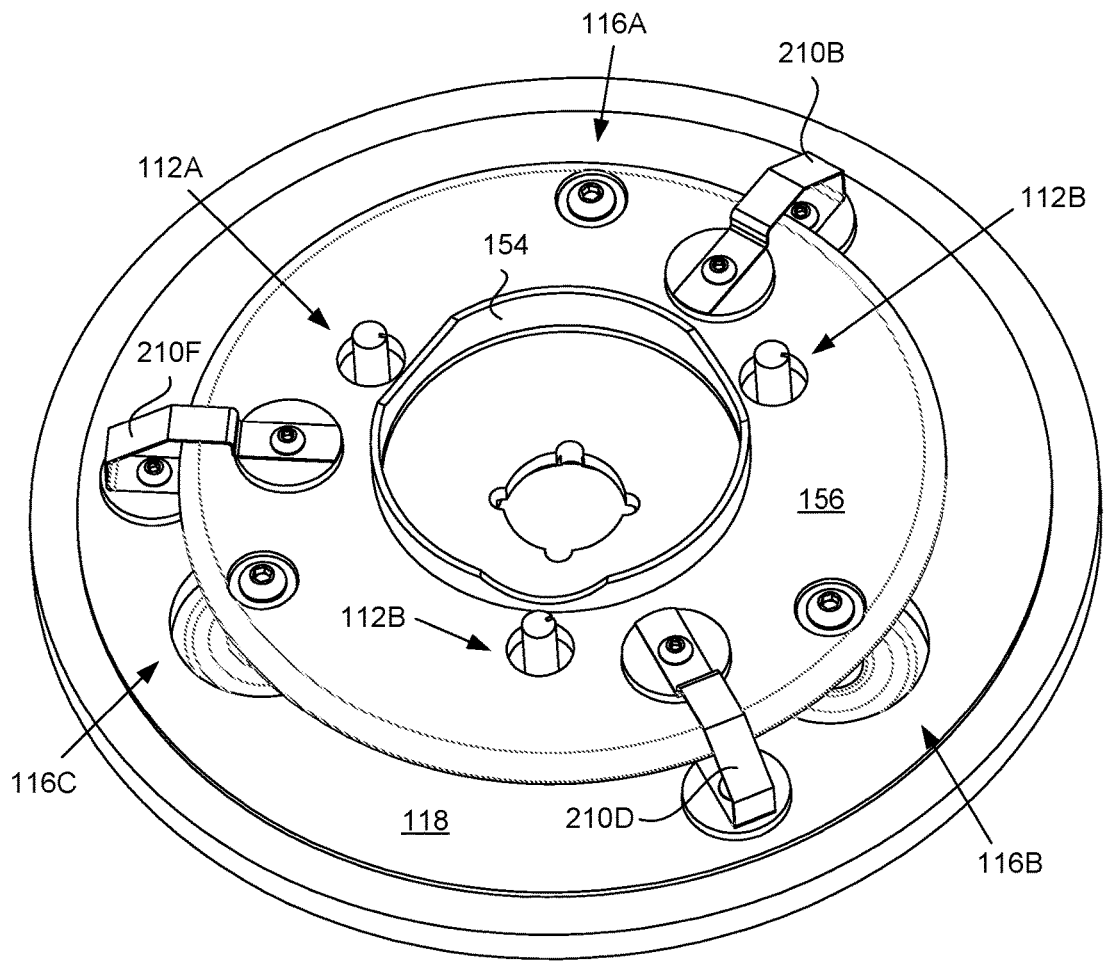
FIG. 16 illustrates a perspective view of an example cathode assembly with three thermal dissipative strap assemblies.

FIG. 16 illustrates a perspective view of an example cathode assembly with three thermal dissipative strap assemblies. As described above, in some embodiments, for a given number of adjustable support structures 116, the number of thermal dissipative strap assemblies 210 may vary. As illustrated, three thermal dissipative strap assemblies 210A-C are included with the three adjustable support structures 116A-C. Each of the thermal dissipative strap assemblies 210A-C is disposed between a pair of the adjustable support structures 116A-C. For example, thermal dissipative strap assembly 210A is between adjustable support structures 116A and 116B.

In some embodiments, each of the thermal dissipative strap assemblies 210A-C is closer to a corresponding one of the adjustable support structures 116A-C. However, in other embodiments, one or more of the thermal dissipative strap assemblies 210A-C may be equidistant from two or more of the adjustable support structures 116A-C.

In some embodiments including large klystrons, such as those configured to operate in L, S, C, and X bands, and in particular sheet beam klystrons, the cathode and heater assembly can be relatively large. The weight of the cathode heater assembly and the thermal load from the cathode heater may constrain potential structural materials, structural configurations, or the like. Where the support structures are also the only path for thermal dissipation, the additional stresses (beyond gravity) from the thermal loading can be detrimental since stresses can lead to and exceed the yield strength of the material. The materials described above that may be used as structural materials may not exhibit the highest thermal conductivity. In addition, the support structures may have minimal cross-sectional area that decreases thermal conductive performance.

When using a thermal dissipation strap assembly 210 or 1210 as described herein, another path for thermal dissipation is created. In particular, another path for thermal dissipation that may not be optimized for structural support is included. In some embodiments, the thermal dissipation strap assembly 210 or 1210 is flexible and does not provide significant structural support between the external base 118 and the internal base 156. As described above, the material of the thermal dissipation strap assembly 210 or 1210 may be selected to optimize thermal conductivity. However, the additional path or paths for thermal dissipation decrease thermal loading on the electron gun support structure, which decreases stresses ($\sigma$). The additional thermal conductive paths redirect heat and thermal stresses away from other features intended solely for mechanical support. The use of the thermal dissipative strap assemblies 210 or 1210 described herein may allow designs with thermal dissipation levels that would otherwise exceed the structural capabilities of the materials of the support structure alone. Alternatively, in some embodiments, a smaller support structure can be used if a limiting factor on the size of the support structure is a need of the support structure to handle a given thermal dissipation within an acceptable failure rate.

Some vacuum devices include electron components (or microwave components), such as an electron gun or a cathode assembly component, are aligned with other features of the vacuum device. Conventionally, for example, the electron components are aligned (i.e., a rough alignment) to the other features of the vacuum device and then the vacuum device is evacuated to put the device under vacuum. Usually, the electron components are internal components that may not be accessible or adjusted on the exterior of the vacuum device (i.e., outside the vacuum). Thus, a conventional vacuum device may not permit additional or fine adjustments of the electron components to provide a fine alignment of the electron components to the other features of the vacuum device. With such a conventional vacuum device, if the initial/rough alignment of the electron components performed prior to putting the device under vacuum along with other corrective mechanisms (e.g., focusing magnets) is not sufficient or adequate, the vacuum device may not operate properly and may even fail. In some cases, the conventional vacuum device may be damaged by the slight misalignment. In other cases, the vacuum needs to be broken, the conventional vacuum device is at least partially disassembled, the electron components are realigned, the device is reassembled, and the device is put under vacuum again, which process can be iterative, time consuming, and expensive.

Often at least one electron component, such as an electron gun or a cathode assembly component 152, is supported and mechanically attached to a structure, such as a base or a plate 156. In an example, the internal base 156 within an evacuated enclosure is coupled to at least one adjustable support 116 that has some portion that is accessible outside the evacuated enclosure enclosing a vacuum. The at least one adjustable support is adjustably coupled to an external base 118 forming at least a portion of the evacuated enclosure. The internal base 156 is within the evacuated enclosure and configured to support at least one cathode assembly component 152. The at least one cathode assembly component 152 includes a cathode, a focus electrode, a heater assembly, a combination of similar components, or the like. The at least one adjustable support includes a flexible component 160, a spacer 162, a threaded shaft 170, an external base support assembly 191, and a threaded hole component 180. The flexible component includes a flexible component periphery that is in contact with the external base 118 at least one opening 119 of the external base. The flexible component can include a bellows 160" or a diaphragm 160' that allows the adjustable support 116 (and internal base 156) to move relative to the external base 118 of the evacuated enclosure while maintaining the vacuum within the evacuated enclosure. The spacer 162 is positioned between a surface of the internal base 156 and a center area of an inner side (i.e., vacuum side) of the flexible component. The spacer 162 provides a gap between the internal base 156 and external base 118. The threaded shaft 170 (or threaded linear shaft) is coupled to the spacer 162 on the center area of an outer side (e.g., exposed or non-vacuum side) of the flexible component 160. The center area of the flexible component 160 is disposed or sandwiched between the spacer 162 and the threaded shaft 170 to provide a vacuum seal at the center area of the flexible component 160. The threaded shaft 170 provides the mechanical attachment (e.g., rigid or fixed coupling) outside the vacuum to the internal base 156. The external base support assembly 191 is coupled to the external base at the at least one opening of the external base. The flexible component 160 periphery is disposed or sandwiched between the external base 118 and the external base support 196 to provide a vacuum seal at the flexible component periphery 160a. The external base support assembly 191 includes an external base support opening 192 and a threaded portion 172 of the threaded shaft 170 extends through the external base support opening 192. The external base support assembly 191 provides the mechanical features on the external base to support the threaded shaft 170 and seal the flexible component periphery 160a. The threaded hole component 180 is threadedly engaged with the threaded portion 172 of the threaded shaft 170 and configured to adjustably move the threaded shaft relative to the external base support assembly 191.

In another example, the external base support assembly 191 includes an external base support 196 and a base cap 190. The external base support 196 is coupled to the external base at the at least one opening of the external base. The flexible component periphery 160a is disposed or sandwiched between the external base 196 and the external base support 196 to provide a vacuum seal at the flexible component periphery 160a. The base cap 190 includes a base cap opening and a base cap periphery 190a. The external base support opening includes the base cap opening 192. A portion of the base cap periphery 190a is coupled to the external base support 196, and the threaded portion 172 of the threaded shaft 170 extends through the base cap opening. The threaded hole component is configured to adjustably move the threaded shaft relative to the base cap 190.

The electron components (or microwave components), such as an electron gun or a cathode assembly component 152, can generate an excessive amount of heat and thermal stress (i.e., high thermal load) on the support features and structure, such as the adjustable support. The heat and thermal stresses on the support features and structure can lead to stress values greater than the yield strength of support features and structure causing the support features and structure to warp, bend, or fail, which can cause misalignment of the electron components with the rest of the device. In some examples with an adjustable support (e.g., 116), the heat and thermal stresses can weld or otherwise fuse the adjustable features (e.g., 172, 173, 180, and 185) together so the adjustable support is no longer adjustable.

In an example, at least one thermal dissipative strap assembly 210 can be used to dissipate heat and relieve thermal stresses on the support features and structure, such as the adjustable support 116. For example, the vacuum device includes an evacuated enclosure with an external base 118, an internal base 156 within the evacuated enclosure, and the at least one thermal dissipative strap assembly 210. The at least one thermal dissipative strap assembly includes an internal base thermal conductive base 220 in contact with the internal base 156, an external base thermal conductive base 230 in contact with the external base, and a flexible thermal dissipative strap 212 coupling the internal base thermal conductive base to the external base thermal conductive base.

In another example, the internal base 156 includes at least one recess 224 configured to receive the internal base thermal conductive base 220 or the external base 118 includes at least one recess 234 configured to receive the external base thermal conductive base 230. In a configuration, the flexible thermal dissipative strap includes a bent flat metal structure. For example, the bent flat metal structure can have at least 3 corners along its length (long side). In another configuration, the flexible thermal dissipative strap includes a bent round, cylindrical, or ellipsoid shaped metal structure, which can bend and flex with movement between the internal base 156 and external base.

In another example, a thermal conductivity of the internal base thermal conductive base 220 is greater than a thermal conductivity of the internal base 156, or the thermal conductivity of the external base thermal conductive base 230 is greater than a thermal conductivity of the external base 118. A thermal conductive base with a high thermal conductivity can help conduct heat away from the support features and structure. In another example at least one thermal dissipative strap 212 has a higher thermal conductivity than the adjustable support assembly 116. In another example, the at least one thermal dissipative strap assembly includes vacuum compatible materials with a maximum total mass loss (TML) of less than 1% and a collected volatile condensable materials (CVCM) from outgassing of less than 0.1% of starting materials at 398 K (125° C.) for at least 24 hours. In an example, the at least one thermal dissipative strap assembly includes bake out materials that can withstand at least 375° C. with minimal outgassing and minimal deformation. In another example, the at least one thermal dissipative strap assembly includes bake out materials that can withstand at least 450° C. with minimal outgassing and minimal deformation. In another example, the at least one thermal dissipative strap assembly includes oxygen-free copper (OFC), oxygen-free electronic (OFE) copper, or oxygen-free high thermal conductivity (OFHC) copper. In another example, the at least one thermal dissipative strap assembly includes gold or platinum.

In another example, the at least one thermal dissipative strap assembly 210 includes a thermal conductive base fastener 222 coupling the internal base thermal conductive base 220 to the internal base 156 or a thermal conductive base fastener 232 coupling the external base thermal conductive base 230 to the external base 118. In another example, the external base includes a heat sink 240 on an opposite surface to a surface where the external base thermal conductive base makes contact with the external base.

In another example, the at least one cathode assembly component 152 includes a focus electrode or cathode. In another example, the vacuum device includes an electron gun or a sheet beam klystron.

Some embodiments include an enclosure 1200 configured to enclose a vacuum, the enclosure 1200 including an external base 118 including an opening; an internal base 156 within the enclosure 1200; and an adjustable support assembly 116 or 1116 adjustably coupling the internal base 156 to the external base 118 and extending through the opening, the adjustable support assembly 116 or 1116 comprising: a threaded shaft 170 extending along a longitudinal axis 172*a* and coupled to the internal base 156; a threaded hole component 180 threadedly engaged with the threaded shaft 170 and coupled to the external base 118 such that the threaded hole component 180 is axially constrained in a direction along the longitudinal axis 172*a* relative to the external base 118 independent of the threaded shaft 170; and a flexible component 160 coupled to the external base 118 and the threaded shaft 170 and sealing the opening.

In some embodiments, the flexible component 160 comprises a periphery in contact with the external base 118 at the at least one opening; the vacuum device further comprises a spacer 162 positioned between a surface of the internal base 156 and an inner side of a center area of the flexible component 160; and the threaded shaft 170 is coupled to the spacer 162 on an outer side of the center area of the flexible component 160, wherein the center area of the flexible component 160 is disposed between the spacer 162 and the threaded shaft 170.

In some embodiments, the flexible component 160 includes at least one of a bellows 160" and a diaphragm 160'.

In some embodiments, the adjustable support assembly 116 or 1116 further comprises: an external base support 196 coupled to the external base 118 at the at least one opening of the external base 118; and a base cap 190 including a base cap opening and a base cap 190 periphery; wherein: a portion of the base cap 190 periphery is coupled to the external base support 196; a threaded portion of the threaded shaft 170 extends through the base cap opening; and the threaded hole component 180 is configured to adjustably move the threaded shaft 170 relative to the base cap 190.

In some embodiments, the flexible component 160 comprises a periphery disposed between the external base 118 and the external base support 196.

In some embodiments, the threaded hole component 180 includes a drive bushing 184 including a drive nut 182; and an inner threaded portion of the drive bushing 184 is threadedly engaged with the threaded portion of the threaded shaft 170 and an outer perimeter of the drive bushing 184 is slidably engaged with the base cap opening.

In some embodiments, the vacuum device further comprises a sleeve bearing 187 slidably engaged with the base cap opening and slidably engaged with the drive bushing 184.

In some embodiments, the vacuum device further comprises at least one drive bushing snap ring 186 configured to restrain the sleeve bearing 187 in a position relative to the drive bushing 184 in the direction along the longitudinal axis 172*a* of the threaded shaft 170.

In some embodiments, the vacuum device further comprises at least one sleeve bearing snap ring 188 configured to restrain the sleeve bearing 187 in a position relative to the base cap 190 in the direction along the longitudinal axis 172*a* of the threaded shaft 170.

In some embodiments, the vacuum device further comprises a jam nut 183 or a shim configured to fix a position of the threaded shaft 170.

In some embodiments, the threaded shaft 170 includes a shaft flange extending in a radial direction from the threaded shaft 170; the shaft flange includes at least one aligning pin 178; the base cap 190 includes at least one base cap 190 aligning pin hole 194; and the at least one aligning pin 178 is slidably engaged with the at least one base cap 190 aligning pin hole 194.

In some embodiments, the external base support 196 includes an opening configured to allow access to a region of the threaded shaft 170 between the base cap 190 and the flexible component 160.

In some embodiments, a length of a threaded engagement of a threaded portion of the threaded shaft 170 with the threaded hole component 180 is at least two times a diameter of the threaded portion of the threaded shaft 170.

In some embodiments, the internal base 156 is configured to support at least one cathode assembly component 152.

In some embodiments, the adjustable support assembly 116 or 1116 is one of three adjustable supports configured to provide a three-point column structure for the at least one cathode assembly component.

In some embodiments, the at least one cathode assembly component 152 includes a focus electrode or cathode.

In some embodiments, the vacuum device includes an electron gun, a sheet beam klystron, a round beam klystron, a multi-beam klystron, a relativistic klystron, a traveling wave tube, a gyrotron, a free electron laser, an electron microscope, an inductive output tube, or a linear accelerator.

Some embodiments include an enclosure 1200 configured to enclose a vacuum, the enclosure 1200 including an external base 118 including an opening; an adjustable support assembly 116 or 1116 coupled to the external base 118 and extending through the opening into the enclosure 1200, the adjustable support assembly 116 or 1116 comprising: a threaded shaft 170 extending along a longitudinal axis 172*a*; a threaded hole component 1180 threadedly engaged with the threaded shaft 170 and coupled to the external base 118 such that the threaded hole component 1180 is axially constrained in a direction along the longitudinal axis 172*a* relative to the external base 118 independent of the threaded shaft 170; and a flexible component 160 coupled to the external base 118 and the threaded shaft 170 and sealing the opening.

In some embodiments, the adjustable support assembly 116 or 1116 further comprises an external base support assembly 191 coupled to the external base 118 and axially constrained along the longitudinal axis 172*a* relative to the external base 118; and the threaded hole component 180 is slidably engaged with the external base support assembly 191.

Some embodiments include an enclosure 1200 configured to enclose a vacuum, the enclosure 1200 including an external base 118 including an opening; an internal base 156 within the enclosure 1200; an adjustable support assembly 116 or 1116 coupling the internal base 156 to the external base 118 and extending through the opening, the adjustable support assembly 116 or 1116 comprising: a shaft 1172 extending along a longitudinal axis 172*a*; an external base support assembly 1191 coupled to the external base 118 and axially constrained along the longitudinal axis 172*a* relative to the external base 118; a threaded component 1180 threadedly engaged with the external base support assembly 1191 and coupled to the shaft 1172 such that the threaded component 180 is axially constrained in a direction along the longitudinal axis 172*a* relative to the shaft 1172 independent of the external base support assembly 1191; and a flexible component 160 coupled to the external base 118 and the shaft 1172 and sealing the opening.

Some embodiments include a vacuum device comprising means for enclosing a vacuum; means for supporting disposed within the means for enclosing a vacuum; means for adjusting a position of the means for supporting; and means for axially constraining the means for adjusting the position of the means for supporting along a longitudinal axis 172*a* of the means for adjusting the position of the means for supporting.

Examples of the means for enclosing a vacuum include the enclosure 1200 or the vacuum device 100.

Examples of the means for supporting disposed within the means for enclosing a vacuum include an internal base 156.

Examples of the means for adjusting a position of the means for supporting include the adjustable support structures 116 or 1116.

Examples of the means for axially constraining the means for adjusting the position of the means for supporting along a longitudinal axis of the means for adjusting the position of the means for supporting include the threaded hole component 180, the snap rings 186 and 187, the base cap 190, the external base support 196, and/or the sleeve bushing 187.

In some embodiments, the vacuum device further comprises means for rotationally constraining the means for adjusting the position of the means for supporting about the longitudinal axis. Examples of the means for rotationally constraining the means for adjusting the position of the means for supporting about the longitudinal axis include the aligning pin 178, the aligning pin hole 194, and the external base support assembly 191 and 1191.

Some embodiments include an enclosure 1200 configured to enclose a vacuum, comprising an external base 118 forming at least a portion of the enclosure 1200; an internal base 156 within the enclosure 1200; and at least one thermal dissipative strap assembly 210 or 1210, comprising: an internal base thermal conductive base 220 or 1220 in contact with the internal base 156; an external base thermal conductive base 230 or 1230 in contact with the external base 118; and a flexible thermal dissipative strap 212 or 1212 coupling the internal base thermal conductive base 220 or 1220 to the external base thermal conductive base 230 or 1230.

In some embodiments, the internal base 156 includes at least one recess configured to receive the internal base thermal conductive base 220 or 1220 or the external base 118 includes at least one recess configured to receive the external base 118 thermal conductive base.

In some embodiments, the flexible thermal dissipative strap 212 or 1212 includes a bent flat metal structure.

In some embodiments, the flexible thermal dissipative strap 212 or 1212 includes a bent round, cylindrical, or ellipsoid shaped metal structure.

In some embodiments, the flexible thermal dissipative strap 212 or 1212 includes a bent flat, round, cylindrical, or ellipsoid shaped metal structure.

In some embodiments, a thermal conductivity of the internal base thermal conductive base 220 or 1220 is greater than a thermal conductivity of the internal base 156, or the thermal conductivity of the external base thermal conductive base 230 or 1230 is greater than a thermal conductivity of the external base 118 or the thermal conductivity of the thermal dissipative strap 212 or 1212 is greater than the thermal conductivity of the support assembly 116 or 1116 or 216.

In some embodiments, the at least one thermal dissipative strap assembly 210 or 1210 includes vacuum compatible materials with a maximum total mass loss (TML) of less than 1% and a collected volatile condensable materials (CVCM) from outgassing of less than 0.1% of starting materials at 398 K (125° C.) for at least 24 hours.

In some embodiments, the at least one thermal dissipative strap assembly 210 or 1210 includes oxygen-free copper (OFC), oxygen-free electronic (OFE) copper, or oxygen-free high thermal conductivity (OFHC) copper.

In some embodiments, the vacuum device further comprises: a thermal conductive base fastener 222 or 232 coupling the internal base thermal conductive base 220 or 1220 to the internal base 156 or coupling the external base thermal conductive base 230 or 1230 to the external base 118.

In some embodiments, the vacuum device further comprises: at least one cathode assembly component 152 supported by the internal base 156.

In some embodiments, the at least one cathode assembly component 152 includes a focus electrode or cathode.

In some embodiments, the external base 118 includes a heat sink 240 on an opposite surface to a surface where the external base thermal conductive base 230 or 1230 makes contact with the external base 118.

In some embodiments, the vacuum device includes an electron gun, a sheet beam klystron, a round beam klystron, a multi-beam klystron, a relativistic klystron, a traveling wave tube, a gyrotron, a free electron laser, an electron microscope, an inductive output tube, or a linear accelerator.

In some embodiments, the vacuum device further comprises an adjustable support assembly 116 or 1116 adjustably coupling the internal base 156 to the external base 118 and extending through an opening in the external base 118, the adjustable support assembly 116 or 1116 comprising: a threaded shaft 170 extending along a longitudinal axis 172a and coupled to the internal base 156; a threaded hole component 180 threadedly engaged with the threaded shaft 170 and coupled to the external base 118 such that the threaded hole component 180 is axially constrained in a direction along the longitudinal axis 172a relative to the external base 118 independent of the threaded shaft 170; and a flexible component 160 coupled to the external base 118 and the threaded shaft 170 and sealing the opening.

Some embodiments include an enclosure 1200 configured to enclose a vacuum; an internal base 156 within the enclosure 1200; a plurality of support assemblies 116, 216, or 1116 penetrating the enclosure 1200 and contacting the internal base 156; and a plurality of thermal dissipative strap assemblies 210 or 1210, each thermal dissipative strap assembly 210 or 1210 comprising: an internal base thermal conductive base 220 or 1220 in contact with the internal base 156; an enclosure thermal conductive base 1230 or 1230a in contact with the enclosure 1200; and a flexible thermal dissipative strap 212 or 1212 coupling the internal base thermal conductive base 220 or 1220 to the enclosure 1200 thermal conductive base; wherein the internal base thermal conductive bases 220 or 1220 of the thermal dissipative strap assemblies 210 or 1210 are disposed on the internal base 156 among contact locations of the support assemblies 116, 216, or 1116 to the internal base 156.

In some embodiments, each of the contact locations of the support assemblies 116, 216, or 1116 to the internal base 156 is adjacent to a corresponding one of the internal base thermal conductive bases 220 or 1220.

In some embodiments, each of the contact locations of the support assemblies 116, 216, or 1116 to the internal base 156 is adjacent to a corresponding two of the internal base thermal conductive bases 220 or 1220.

In some embodiments, the support assemblies 116, 216, or 1216 comprise three support assemblies 116, 216, or 1116 configured to provide a three-point column structure for the internal base 156; and the thermal dissipative strap assemblies comprise three thermal dissipative strap assemblies.

In some embodiments, the support assemblies 116, 216, or 1116 comprise three support assemblies 116, 216, or 1116 configured to provide a three-point column structure for the internal base 156; the thermal dissipative strap assemblies comprise six thermal dissipative strap assemblies; and two of the thermal dissipative strap assemblies are disposed between each pair of the three support assemblies 116, 216, or 1116.

In some embodiments, the enclosure 1200 comprises an external base 118 forming at least a portion of the enclosure 1200; and the enclosure thermal conductive base 1230a is an external base thermal conductive base 1230 disposed on the external base 118.

Some embodiments include a vacuum device comprising means for enclosing a vacuum; means for generating heat disposed within the means for enclosing the vacuum; means for supporting the means for generating heat; and means for reducing the heat conducted to the means for enclosing the vacuum through the means for supporting the means for generating heat.

Examples of the means for enclosing a vacuum include enclosure 1200 and vacuum device 100.

Examples of the means for generating heat disposed within the means for enclosing the vacuum include the internal base 156 and the cathode assembly components 152.

Examples of the means for supporting the means for generating heat include the support assemblies 216 or adjustable support assemblies 116 or 1116.

Examples of the means for reducing the heat conducted to the means for enclosing the vacuum through the means for supporting the means for generating heat include thermal dissipative strap assemblies 210 or 1210.

In some embodiments, the vacuum device further comprises means for dissipating heat disposed on a surface of the means for enclosing the vacuum opposite to a surface of the means for enclosing the vacuum contacting the means for reducing the heat conducted to the means for enclosing the vacuum. Examples of the means for dissipating heat include the heat sink 240.

All references recited herein are incorporated herein by specific reference in their entirety.

Although the features, characteristics, structures, devices, methods, and systems have been described in accordance with particular embodiments, one of ordinary skill in the art will readily recognize that many variations to the particular embodiments are possible, and any variations should therefore be considered to be within the principles, concepts, and scope disclosed herein. Accordingly, many modifications may be made by one of ordinary skill in the art without departing from the principles, concepts, and scope of the appended claims. Furthermore, the described features, structures, or characteristics may be combined in a suitable manner in one or more embodiments. In the previous description, numerous specific details are provided (e.g., examples of layouts and designs) to provide a thorough understanding of embodiments of the invention. One skilled in the relevant art will recognize, however, that the invention can be practiced without one or more of the specific details, or with other methods, components, layouts, etc. In other instances, well-known structures, components, or operations are not shown or described in detail to avoid obscuring aspects of the invention.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments; claim 5 can depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Reference throughout this specification to an "example" or an "embodiment" means that a particular feature, structure, or characteristic described in connection with the example is included in at least one embodiment of the invention. Thus, appearances of the words an "example" or an "embodiment" in various places throughout this specification are not necessarily all referring to the same embodiment. Elements specifically recited in means-plus-function format, if any, are intended to be construed to cover the corresponding structure, material, or acts described herein and equivalents thereof in accordance with 35 U.S.C. § 112 ¶ 6. Embodiments of the invention in which an exclusive property or privilege is claimed are defined as follows.

What is claimed is:

1. A vacuum device, comprising:
   an enclosure configured to enclose a vacuum, the enclosure including an external base including an opening;
   an internal base within the enclosure; and
   an adjustable support assembly adjustably coupling the internal base to the external base and extending through the opening, the adjustable support assembly comprising:
   a threaded shaft extending along a longitudinal axis and coupled to the internal base;
   a threaded hole component threadedly engaged with the threaded shaft and coupled to the external base such that the threaded hole component is axially constrained in a direction along the longitudinal axis relative to the external base independent of the threaded shaft; and
   a flexible component coupled to the external base and the threaded shaft and sealing the opening.

2. The vacuum device of claim 1, wherein:
   the flexible component comprises a periphery in contact with the external base at the at least one opening;
   the vacuum device further comprises a spacer positioned between a surface of the internal base and an inner side of a center area of the flexible component; and
   the threaded shaft is coupled to the spacer on an outer side of the center area of the flexible component, wherein the center area of the flexible component is disposed between the spacer and the threaded shaft.

3. The vacuum device of claim 1, wherein the flexible component includes at least one of a bellows and a diaphragm.

4. The vacuum device of claim 1, wherein the adjustable support assembly further comprises:
   an external base support coupled to the external base at the at least one opening of the external base; and
   a base cap including a base cap opening and a base cap periphery;
   wherein:
   a portion of the base cap periphery is coupled to the external base support;
   a threaded portion of the threaded shaft extends through the base cap opening; and
   the threaded hole component is configured to adjustably move the threaded shaft relative to the base cap.

5. The vacuum device of claim 4, wherein
   the threaded hole component includes a drive bushing including a drive nut; and
   an inner threaded portion of the drive bushing is threadedly engaged with the threaded portion of the threaded shaft and an outer perimeter of the drive bushing is slidably engaged with the base cap opening.

6. The vacuum device of claim 4, further comprising a sleeve bearing slidably engaged with the base cap opening and slidably engaged with the drive bushing.

7. The vacuum device of claim 6, further comprising at least one drive bushing snap ring configured to restrain the sleeve bearing in a position relative to the drive bushing in the direction along the longitudinal axis of the threaded shaft.

8. The vacuum device of claim 6, further comprising at least one sleeve bearing snap ring configured to restrain the sleeve bearing in a position relative to the base cap in the direction along the longitudinal axis of the threaded shaft.

9. The vacuum device of claim 4, wherein the threaded shaft is coupled to the base cap such that the threaded shaft is rotationally constrained about the longitudinal axis.

10. The vacuum device of claim 4, further comprising a jam nut or a shim configured to fix a position of the threaded shaft.

11. The vacuum device of claim 4, wherein:
    the threaded shaft includes a shaft flange extending in a radial direction from the threaded shaft;
    the shaft flange includes at least one aligning pin;
    the base cap includes at least one base cap aligning pin hole; and
    the at least one aligning pin is slidably engaged with the at least one base cap aligning pin hole.

12. The vacuum device of claim 4, wherein the external base support includes an opening configured to allow access to a region of the threaded shaft between the base cap and the flexible component.

13. The vacuum device of claim 1, wherein a length of a threaded engagement of a threaded portion of the threaded shaft with the threaded hole component is at least two times a diameter of the threaded portion of the threaded shaft.

14. The vacuum device of claim 1, wherein the internal base is configured to support at least one cathode assembly component.

15. The vacuum device of claim 14, wherein the adjustable support assembly is one of three adjustable supports configured to provide a three-point column structure for the at least one cathode assembly component.

16. The vacuum device of claim 14, wherein the at least one cathode assembly component includes a focus electrode or cathode.

17. The vacuum device of claim 1, wherein the vacuum device includes an electron gun, a sheet beam klystron, a round beam klystron, a multi-beam klystron, a relativistic klystron, a traveling wave tube, a gyrotron, a free electron laser, an electron microscope, an inductive output tube, or a linear accelerator.

18. A vacuum device, comprising:
    an enclosure configured to enclose a vacuum, the enclosure including an external base including an opening;
    an internal base within the enclosure;
    an adjustable support assembly coupling the internal base to the external base and extending through the opening, the adjustable support assembly comprising:
    a shaft extending along a longitudinal axis;
    an external base support assembly coupled to the external base and axially constrained along the longitudinal axis relative to the external base;
    a threaded component threadedly engaged with the external base support assembly and coupled to the shaft such that the threaded component is axially constrained in a direction along the longitudinal axis relative to the shaft independent of the external base support assembly; and a flexible component coupled to the external base and the shaft and sealing the opening.

19. A vacuum device, comprising:

means for enclosing a vacuum;

means for supporting disposed within the means for enclosing a vacuum;

means for adjusting a position of the means for supporting; and means for axially constraining the means for adjusting the position of the means for supporting along a longitudinal axis of the means for adjusting the position of the means for supporting.

20. The vacuum device of claim 19, comprising:

means for rotationally constraining the means for adjusting the position of the means for supporting about the longitudinal axis.

\* \* \* \* \*